(12) United States Patent
Sugano

(10) Patent No.: US 7,725,795 B2
(45) Date of Patent: May 25, 2010

(54) LOAD GENERATING APPARATUS AND LOAD TESTING METHOD

(75) Inventor: Fumitake Sugano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 440 days.

(21) Appl. No.: 11/790,262

(22) Filed: Apr. 24, 2007

(65) Prior Publication Data
US 2008/0059858 A1 Mar. 6, 2008

(30) Foreign Application Priority Data
Aug. 31, 2006 (JP) ............................ 2006-236266

(51) Int. Cl.
*G01R 31/28* (2006.01)
*G11C 29/00* (2006.01)
(52) U.S. Cl. .................. 714/743; 714/719; 714/763
(58) Field of Classification Search ................. 714/718, 714/719, 743, 763, 738, 819, 735
See application file for complete search history.

(56) References Cited

U.S. PATENT DOCUMENTS

| | | | | |
|---|---|---|---|---|
| 5,043,874 A | * | 8/1991 | Gagliardo et al. | ........... 711/151 |
| 5,748,977 A | * | 5/1998 | Kawasaki et al. | ............. 712/33 |
| 5,987,589 A | * | 11/1999 | Kawasaki et al. | ............. 712/32 |
| 2006/0200720 A1 | * | 9/2006 | Grimme et al. | ............. 714/738 |

FOREIGN PATENT DOCUMENTS

| | | |
|---|---|---|
| JP | 8-313602 | 11/1996 |
| JP | 10-312311 | 11/1998 |

* cited by examiner

*Primary Examiner*—Phung M Chung
(74) *Attorney, Agent, or Firm*—Staas & Halsey LLP

(57) ABSTRACT

A load generating apparatus for applying a load on a bus of a test target system, has a mode setting register to which an operation mode is set, a data size register to which a data size of one data transfer is set, a register group to which a base address which is a first access target address, an address interval for every stride executed by a stride function, and a number of strides are set, and an access part configured to access a memory space within the test target system based on the data size set in the data size register and information set in the register group, depending on the operation mode set in the mode setting register. The access part includes a mechanism to change the access target address to the memory space at the address interval, and a mechanism to generate a data pattern depending on the address interval and the data size, with respect to the memory space of the access target.

13 Claims, 22 Drawing Sheets

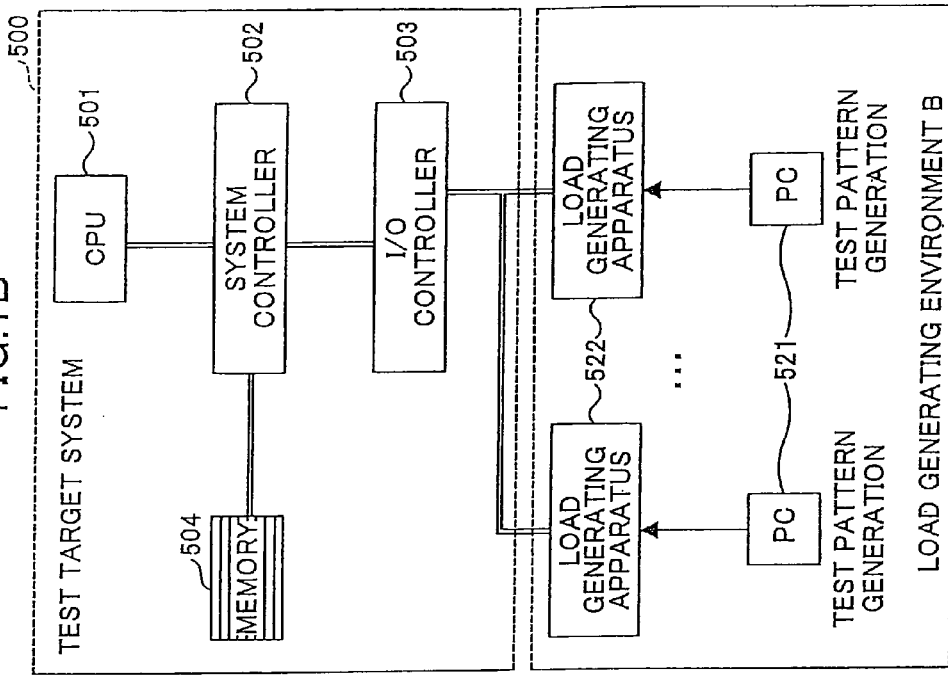
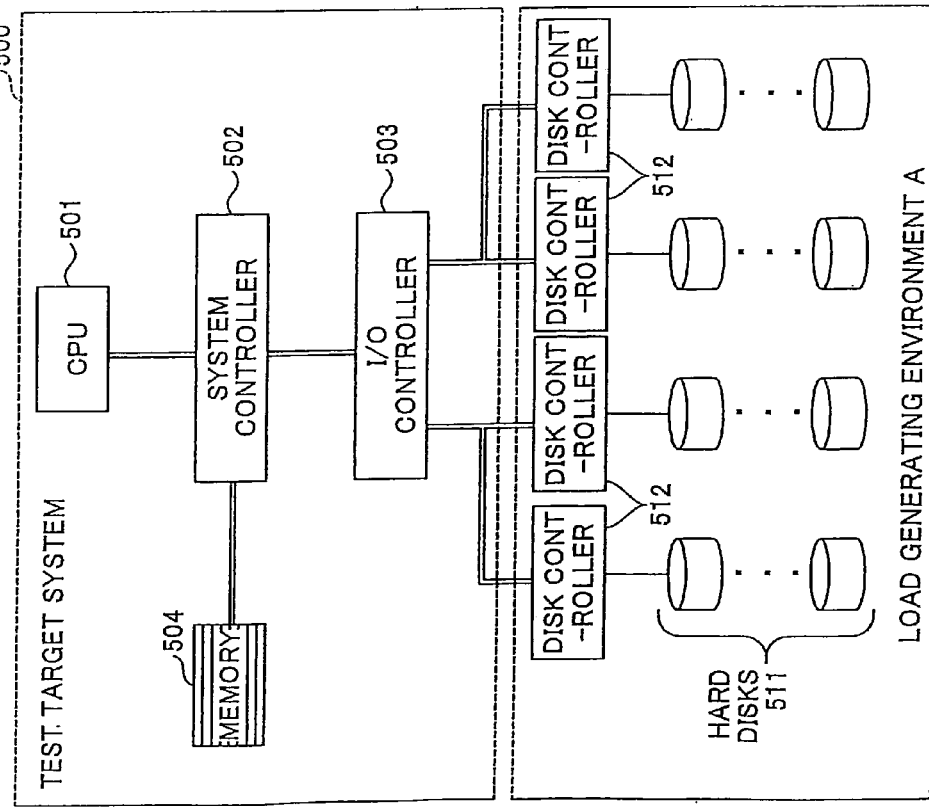

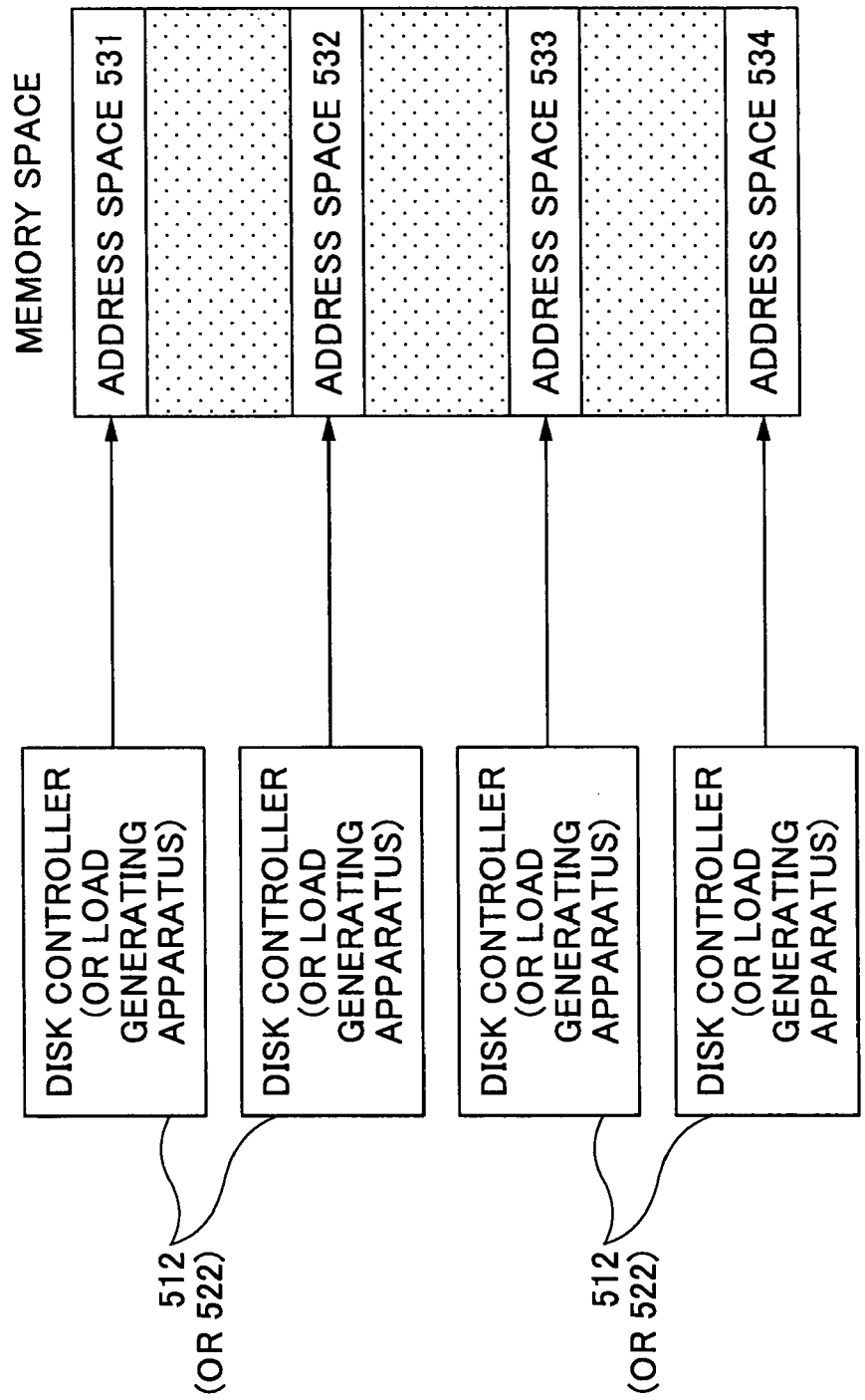

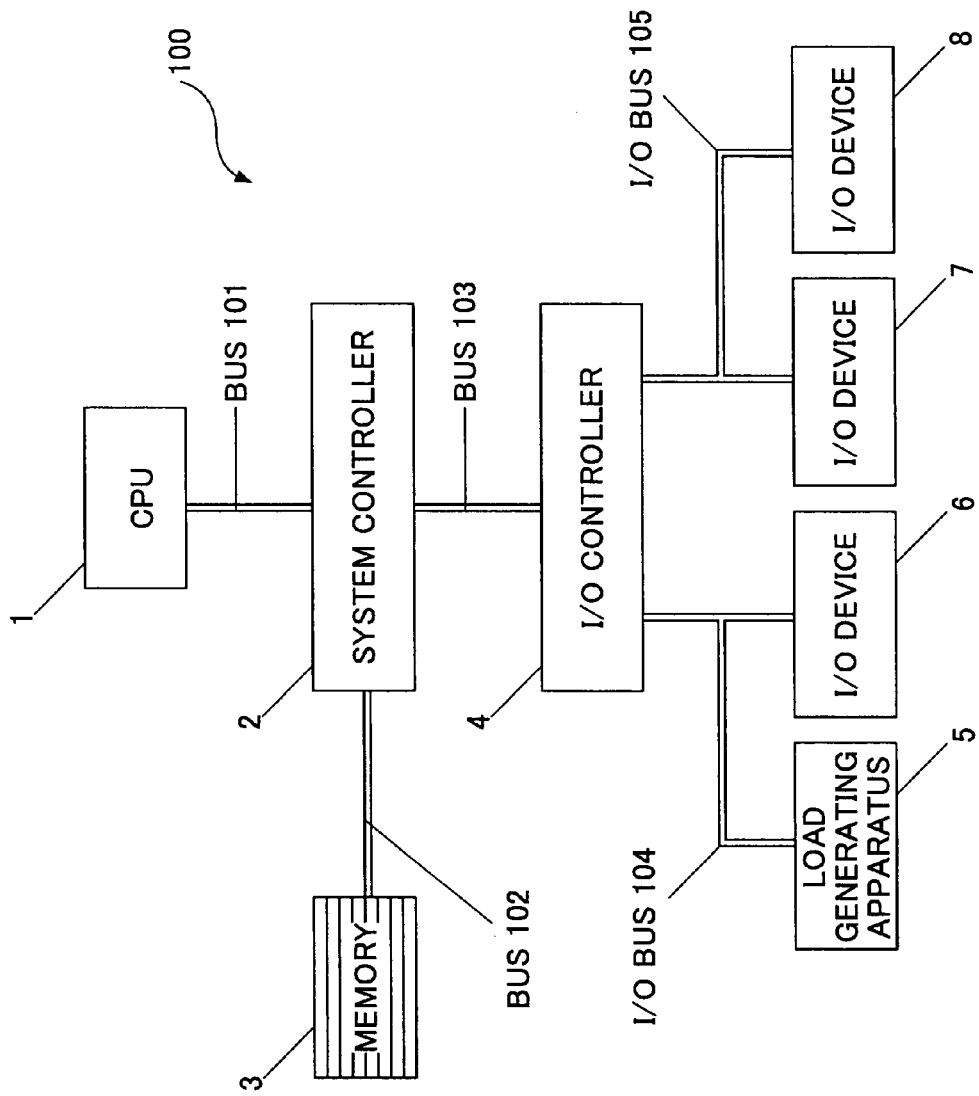

FIG.6A  SAR > (DATA SIZE REGISTER)
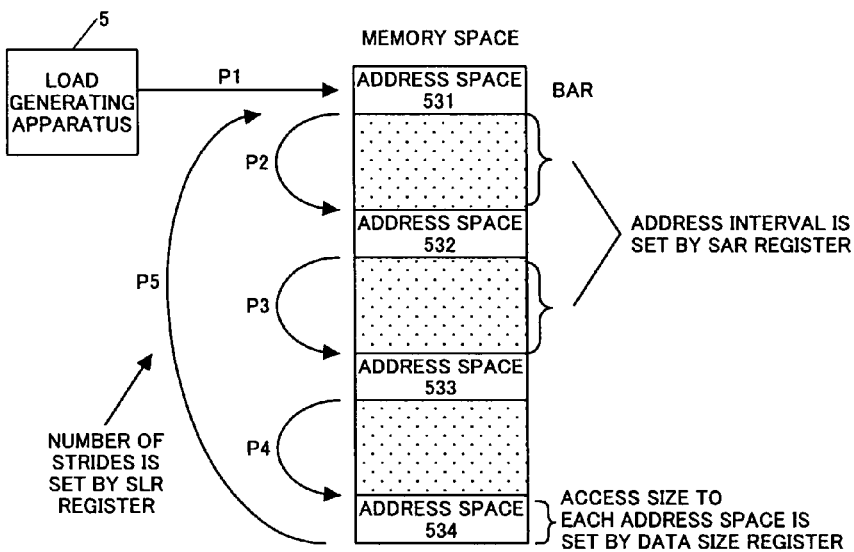
FIG.6B  SAR = (DATA SIZE REGISTER)
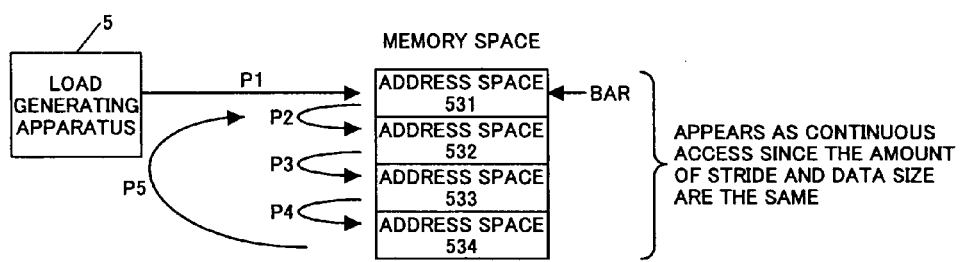
FIG.6C  SAR < (DATA SIZE REGISTER)
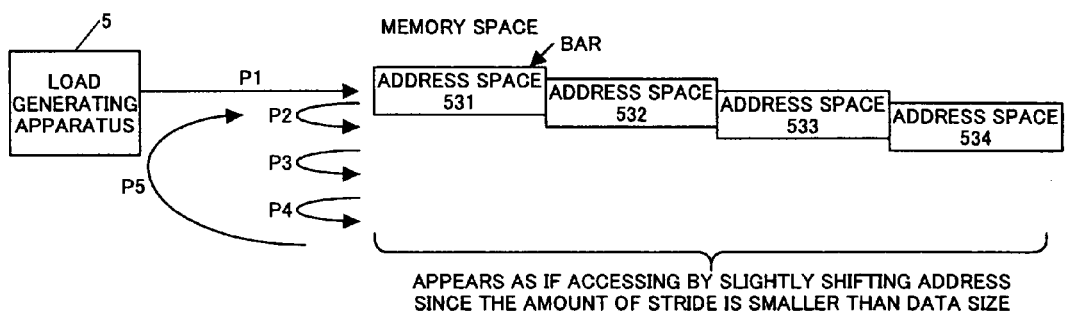

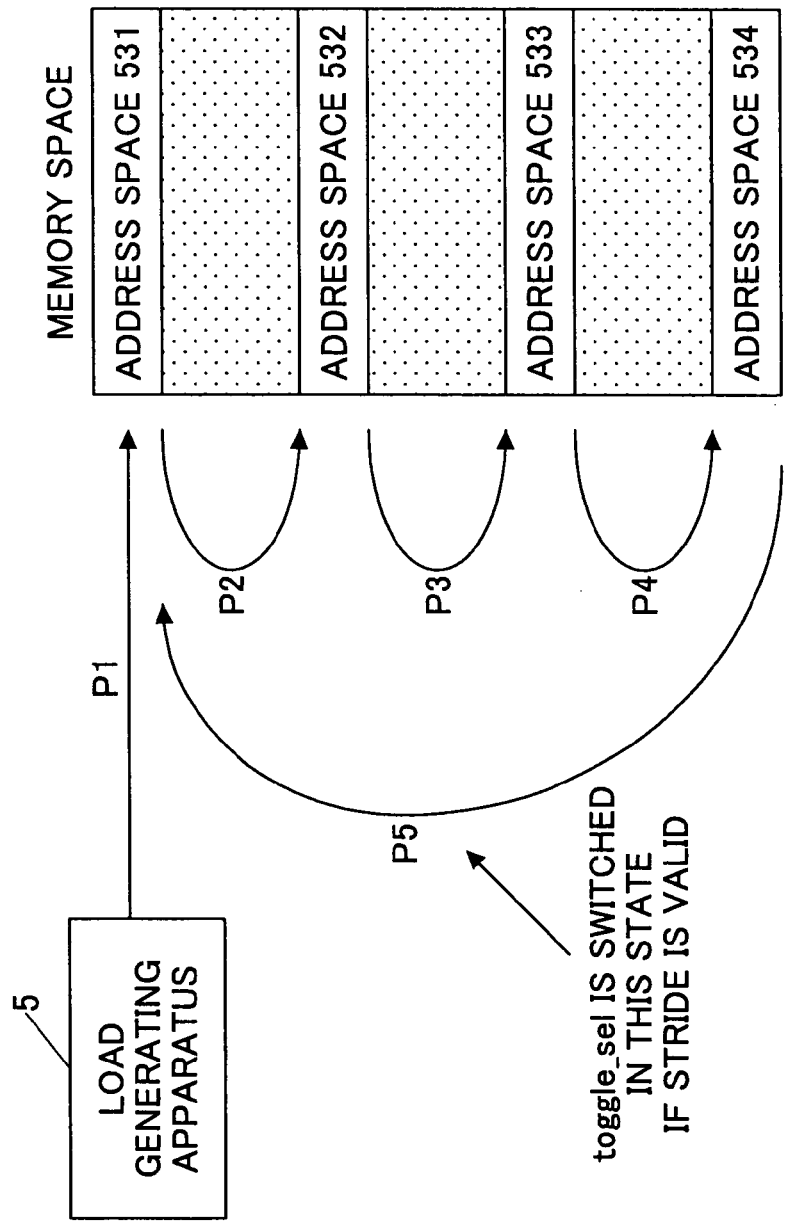

FIG.10

| mode_op | adr_sel (STRIDE = OFF) & badr_sel | | | ADR_sel (STRIDE = ON) |
|---|---|---|---|---|
| | INITIAL VALUE | status_change: ODD | status_change: EVEN | |
| 00 | | SELECT OUTPUT OF BAR | | OUTPUT OF ADDRESS ADDER 44 |
| 01 | | SELECT OUTPUT OF MVDA | SELECT OUTPUT OF MVDA | |
| 10 | | SELECT OUTPUT OF MVDA | SELECT OUTPUT OF MVDA | |
| 11 | SELECT OUTPUT OF MVSA | | | |

FIG.11

| mode_op | STRIDE = OFF | STRIDE = ON |
|---|---|---|
| 00 | SELECT OUTPUT OF DATA 48 | SELECT OUTPUT OF XOR 49 |
| 01 | | |
| 10 | | SELECT OUTPUT OF DATA 48 |
| 11 | | |

FIG.12

| mode_op | STRIDE = OFF | STRIDE = ON |
|---|---|---|
| 00 | AFTER ISSUING status_change | AFTER ISSUING status_change & stride_next |
| 01 | toggle_change NOT ISSUED | |
| 10 | AFTER READ | AFTER READ & ISSUING stride_next |
| 11 | toggle_change NOT ISSUED | |

LOAD GENERATING APPARATUS AND LOAD TESTING METHOD

CROSS REFERENCE TO RELATED APPLICATIONS

This application claims the benefit of Japanese Patent Application 2006-236266 filed Aug. 31, 2006, in the Japanese Patent Office, the disclosure of which is hereby incorporated by reference.

BACKGROUND OF THE INVENTION

1. Field of the Invention

The present invention generally relates to load generating apparatuses and load testing methods, and more particularly to a load generating apparatus which has address controlling and data generating functions and applies a load on a bus of a test target system, and to a load testing method that uses such a load generating apparatus.

2. Description of the Related Art

FIGS. 1A and 1B are diagrams for explaining conventional load generating environments that apply a large load on a test target system, such as a personal computer and a server. In FIGS. 1A and 1B, a test target system 500 has a CPU 501, a system controller 502, an input and output (I/O) controller 503, and a memory 504.

In the case of a load generating environment A shown in FIG. 1A, a large number of hard disks 511 and a plurality of disk controllers 512 are required because there are a plurality of transmitting addresses for the data patterns and data. On the other hand, in the case of a load generating environment B shown in FIG. 1B, the generation of the test pattern, including the generation of data patterns, is committed to a plurality of external apparatuses such as personal computers (PCs) 521, and each load generating apparatus 522 in the load generating environment B only has a role of an interface with respect to the test target system 500 which executes only the external test patterns. In addition, since the test target system 500 and the PCs 521 that generate the test pattern are separated in the load generating environment B, a complex control, such as synchronizing the test target system 500 and the PCs 521 and controlling the load generating timing, becomes necessary in order to improve the load efficiency in the case of a long-term test.

FIG. 2 is a diagram for explaining generation of the load in the load generating environments A and B. As shown in FIG. 2, with respect to each of address spaces 531 through 534 of the memory 504 which becomes a main memory, for example, a load target address (that is, an access target address) is determined for each disk controller 512 or for each load generating apparatus 522. In the load generating environment A, it is possible to make a single disk controller operate similarly to the plurality of disk controllers 512, but this requires complex control by software, and the load applied to the test target system 500 does not become large due to the software intervention. In the load generating environment B, the test patterns should be changed for the address space 531→the address space 532→the address space 533→the address space 534, but since the test patterns are generated by the PCs 521, the load generating apparatus 522 does not have the function of generating such test patterns.

As a technique that is often used to increase the efficiency with which the load is applied to the test target system 500, there is a conventional load testing method that applies the load for each of the WAYs of the CPU 501. If it is assumed that the address spaces 531 through 534 shown in FIG. 2 are cache regions of each of the WAYs of the CPU 501, this conventional load testing method requires a number of disk controllers 512 corresponding to the number of WAYs or, a number of load generating apparatuses 522 corresponding to the number of WAYs. In addition, the structure of the disk controllers 512 or the load generating apparatus 522 becomes different if the number of WAYs of the cache becomes different depending on the structure of the test target system 500.

Therefore, according to the conventional load testing method, large-scale hardware resources are required because of the need to prepare load data patterns using extended storages such as the hard disks 511 and the extended memories (not shown) of the PCs 521. In addition, in both the load generating environments A and B, a complex control by software is required or, an extremely large amount of test patterns is required. As a result, it is not easy to build a testing (or inspecting) system for carrying out the load test on the test target system, and it is also difficult to easily carry out the debugging.

The applicant is aware of the background art described in Japanese Laid-Open Patent Applications No. 8-313602 and No. 10-312311.

Accordingly, in the conventional load testing method, there were problems in that it is difficult to efficiently apply a large load on the test target system, and that large-scale hardware resources are required, due to the complex software control.

SUMMARY OF THE INVENTION

Accordingly, it is a general object of the present invention to provide a novel and useful load generating apparatus and load testing method, in which the problems described above are suppressed.

Another and more specific object of the present invention is to provide a load generating apparatus and a load testing method, which does not require a complex software control and can apply a large load on a test target system with a high efficiency using a relatively small amount of hardware resources.

Still another object of the present invention is to provide a load generating apparatus for applying a load on a bus of a test target system, comprising a mode setting register to which an operation mode is set; a data size register to which a data size of one data transfer is set; a register group to which a base address which is a first access target address, an address interval for every stride executed by a stride function, and a number of strides are set; and an access part configured to access a memory space within the test target system based on the data size set in the data size register and information set in the register group, depending on the operation mode set in the mode setting register, wherein the access part includes a changing mechanism configured to change the access target address to the memory space at the address interval, and a generating mechanism configured to generate a data pattern depending on the address interval and the data size, with respect to the memory space of the access target. According to the load generating apparatus of the present invention, it is unnecessary to carry out a complex software control, and a large load can be applied on a test target system with a high efficiency using a relatively small amount of hardware resources.

A further object of the present invention is to provide a load testing method for applying a load on a bus of a test target system, comprising a setting step setting from the test target system to registers within a load generating apparatus, prior to a test of the test target system, an operation mode, a data size of one data transfer, a base address which is a first access target address, an address interval for every stride executed by a stride function, and a number of strides; and an accessing step accessing a memory space within the test target system from the load generating apparatus, based on the data size, the base address, the address interval, and the number of strides that are set by the setting step, depending on the operation mode that is set by the setting step, wherein the accessing step includes a changing step changing the access target address to the memory space at the address interval, and a generating step generating a data pattern depending on the address interval and the data size, with respect to the memory space of the access target. According to the load testing method of the present invention, it is unnecessary to carry out a complex software control, and a large load can be applied on a test target system with a high efficiency using a relatively small amount of hardware resources.

Other objects and further features of the present invention will be apparent from the following detailed description when read in conjunction with the accompanying drawings.

BRIEF DESCRIPTION OF THE DRAWINGS

FIGS. 1A and 1B are diagrams for explaining conventional load generating environments that apply a large load on a test target system;

FIG. 2 is a diagram for explaining generation of load in load generating environments A and B;

FIG. 3 is a system block diagram showing a first embodiment of a load generating apparatus according to the present invention together with a test target system which becomes a target of a load test;

FIGS. 6A through 6C are diagrams for explaining memory access operations for first, fourth and fifth mechanisms;

FIG. 9 is a diagram showing a switching timing of a signal toggle_sel by the ninth mechanism;

FIG. 10 is a table showing address selecting conditions of signals adr_sel and base_sel in various operation modes of the load generating apparatus;

FIG. 11 is a table showing selecting conditions of output data of a DATA register in various operation modes of the load generating apparatus;

FIG. 12 is a table showing issue timing conditions of a signal toggle_change in various operation modes of the load generating apparatus;

DESCRIPTION OF THE PREFERRED EMBODIMENTS

Figure 4:
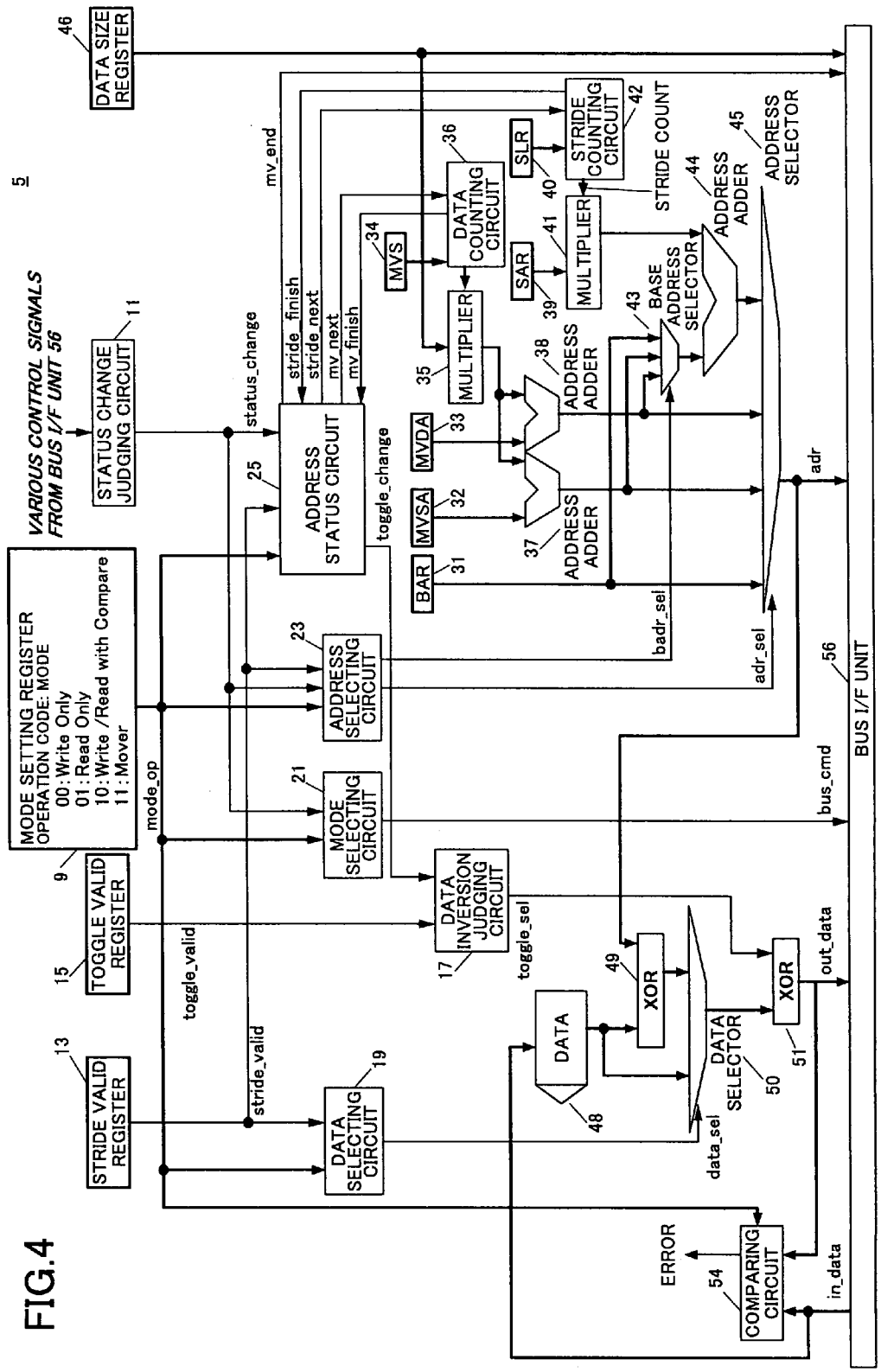
FIG. 4 is a block diagram showing a structure of the load generating apparatus.

In the present invention, a load generating apparatus that applies a load on a bus of a test target system, is at least provided with a first mechanism, of first through nineteenth mechanisms described below.

The first mechanism automatically changes a load target address (that is, an access target address) into a memory space at an arbitrary address interval.

The second mechanism generates an arbitrary data pattern with respect to the memory space of the load target.

The third mechanism changes the data for each address according to a combination of the first and second mechanisms.

The fourth mechanism makes continuous access to a large memory space by combining the first mechanism and a mechanism that can arbitrarily change the data size.

The fifth mechanism makes access to the memory space while slightly shifting the address by combining the first mechanism and the mechanism that can arbitrarily change the data size.

The sixth mechanism does not continuously write the same data when writing the load pattern to the same load target address (that is, the access target address).

The seventh mechanism writes the load pattern to the load target address (that is, the access target address) even without software control, executes a load test according to a read sequence, and compares and checks the read data and the write data within the load generating apparatus.

The eighth mechanism executes a memory copy of the load pattern solely by the load generating apparatus without software control.

The ninth mechanism is a combination of the sixth and seventh mechanisms described above.

The tenth mechanism is a combination of the third and seventh mechanisms described above.

The eleventh mechanism is a combination of the ninth and tenth mechanisms described above.

The twelfth mechanism is a combination of the first and eighth mechanisms described above.

The thirteenth mechanism is a combination of the fourth and eighth mechanisms described above.

The fourteenth mechanism is a combination of the fifth and eighth mechanisms described above.

The fifteenth mechanism invalidates the data conversion functions of the second, third and sixth mechanisms described above in one of the twelfth through fourteenth mechanisms described above.

The sixteenth mechanism includes a plurality of mechanisms that include all of the first through fifteenth mechanisms described above, and realizes random test patterns by making it possible to independently set the parameters.

The seventeenth mechanism realizes random test patterns by making it possible for each unit of the thirteenth mechanism described above to independently adjust the request interval to the I/O bus.

The eighteenth mechanism has a target address space for the load test.

The nineteenth mechanism only requires a data region for a maximum amount of transfer of the bus.

Next, a description will be given of each embodiment of the load generating apparatus and the load testing method according to the present invention, by referring to FIG. 3 and the subsequent figures.

First Embodiment

FIG. 3 is a system block diagram showing a first embodiment of the load generating apparatus according to the present invention together with a test target system which becomes a target of a load test. This first embodiment of the load generating apparatus employs a first embodiment of the load testing method according to the present invention. In FIG. 3, a test target system 100 at least has a CPU 1, a system controller 2, and a memory 3. The test target system 100 may include an input and output (I/O) controller 4. The CPU 1 and the system controller 2 are connected via a bus 101. The system controller 2 and the memory 3 are connected via a bus 102. The system controller 2 and the I/O controller 4 are connected via a bus 103. The I/O controller 4 is connected to a load generating apparatus 5 via an I/O bus 104, connected to an I/O device 6 via the I/O bus 104, and is connected to I/O devices 7 and 8 via an I/O bus 105.

The system controller 21 controls accesses from the CPU 1 and the I/O devices 6 through 8 or, controls accesses to the memory 3. The memory 3 forms a main memory of the test target system 100. The I/O controller 4 controls accesses of the I/O devices 6 through 8. The I/O devices 6 through 8, controlled by the I/O controller 4, are devices other than the load generating apparatus 5 which forms this embodiment. The I/O devices 6 through 8 and the load generating apparatus 5 are simultaneously connectable to the test target system 100.

A load may be applied to the test target system 100 by creating patterns for DMA in the load generating apparatus 5 and executing the DMA. In this state, by making the memory 3 the DMA target, the access from the load generating apparatus 5 to the memory 3 is made via the I/O bus 104→the bus 103→the bus 102→the memory 3, thereby making it possible to apply the load with respect to the test target system 100. In addition, the access from the CPU 1 to the load generating apparatus 5 can be made and the load propagates via the CPU 1→the bus 101→the bus 103→the I/O bus 104→the load generating apparatus 5, thereby making it possible to apply the load with respect to the test target system 100. Furthermore, if the hardware architecture of the test target system 100 permits, the access can be made between the load generating apparatus 5 and the I/O devices 6 through 8, thereby making it possible to apply the load on only one or a plurality of arbitrary I/O devices of the I/O devices 6 through 8. The access from the load generating apparatus 5 and the access to the load generating apparatus 5 may be made simultaneously. When the load test with respect to the test target system 100 is made using a single test pattern between the load generating apparatus 5 and the memory 3, between the load generating apparatus 5 and the CPU 1, and between the load generating apparatus 5 and the I/O devices 6 through 8, it is possible to apply the load on the entire test target system 100.

The I/O bus 104 to which the load generating apparatus 5 shown in FIG. 3 is connected, is a general-purpose bus such as that of the PCI, PCI-X and PCI-express, and the load generating apparatus 5 of this embodiment has the same size as the general I/O device card (for example, a LAN card of the PCI bus, a graphics card and the like), unlike the conventional apparatus which requires large-scale hardware resources. Because the load generating apparatus 5 is connectable to the test target system 100 if the test target system 100 has the general-purpose bus, the dependency of the load generating apparatus 5 on the structure of the test target system 100 is small.

Depending on the conventional load testing method, the large-scale hardware resources are required. As a result, according to the conventional load testing method, the location where the load test on the test target system is carried out is limited, and it is difficult to mass produce the special apparatus having the large-scale hardware resources, thereby making it is difficult to conventionally prepare an environment that enables the load test to be carried out simultaneously with respect to a plurality of test target systems. But according to this embodiment, it is sufficient to prepare a space for setting up the test target system or systems, and it is possible to simultaneously carry out the load test with respect to a plurality of test target systems.

The load generating apparatus 5 of this embodiment has four operation modes which will be described later, and a different operation is carried out depending on the operation mode. The operation of the load generating apparatus 5 during each operation mode will now be described in conjunction with FIG. 4. FIG. 4 is a block diagram showing the structure of the load generating apparatus 5.

The load generating apparatus 5 has a mode setting register 9, a status change judging circuit 11, a stride valid register 13, a toggle valid register 15, a data inversion judging circuit 17, a data selecting circuit 19, a mode selecting circuit 21, an address selecting circuit 23, an address status circuit 25, an address register (BAR register) 31, an address register (MVSA register) 32, an address register (MVDA register) 33, a register (MVS register) 34, a multiplier 35, a data counting circuit 36, address adders 37 and 38, a register (SAR register) 39, a register (SLR register) 40, a multiplier 41 a stride counting circuit 42, a base address selector 43, an address adder 44, an address selector 45, a data size register 46, a register (DATA register) 48, an exclusive-OR circuit (XOR) 49, a data selector 50, an exclusive-OR circuit (XOR) 51, a comparing circuit 54, and a bus interface unit 56 that are connected as shown in FIG. 4. The bus interface unit 56 is connected to the I/O bus 104 shown in FIG. 3, and delivers various control signals to the status change judging circuit 11.

First, a description will be given of the main registers. The mode setting register 9 stores an operation code for determining a bus operation of the load generating apparatus 5. If the operation code stored in the mode setting register 9 is "00", this indicates that the operation mode is a Write Only (WO) mode in which only a write operation is made with respect to the bus from the load generating apparatus 5. In this WO mode, both the address and data are output from the load generating apparatus 5. If the operation code stored in the mode setting register 9 is "01", this indicates tat the operation mode is a Read Only (RO) mode in which only a read operation is made with respect to the bus from the load generating apparatus 5. In this RO mode, the address is output from the load generating apparatus 5, and the data is input to the load generating apparatus 5. If the operation code stored in the mode setting register 9 is "10", this indicates that the operation mode is a Write/Read with Compare (WRC) mode in which the write operation and the read operation are sequentially made with respect to the bus from the load generating apparatus 5 and an inspection is made during the read operation to check whether the data that is written and the data that is read match. If the operation code stored in the mode setting register 9 is "11", this indicates that the operation mode is a Mover (M) mode which realizes a memory copy function for reading data from a certain address space and writing the data to a different address space. In this specification, the operation or process of reading the data from the certain address space and writing the data to the different address space in the M mode, is also referred to as a mover function.

The stride valid (or ON/OFF) register 13 is provided to realize and validate the first through fourth mechanisms described above.

The toggle valid (or ON/OFF) register 15 is provided to realize and validate the fifth mechanism described above.

The BAR register 31 is provided to realize and validate the seventh mechanism described above. This BAR register 31 is used when a signal mode_op, which indicates the operation mode and is read from the mode setting register 9, is other than "11" and indicates an operation mode other than the M mode.

The MVSA register 32 is provided to realize and validate the eighth mechanism described above. This MVSA register 32 is used to store the necessary address of the moving source when the signal mode_op read from the mode setting register 9 is "11" and indicates the M mode.

The MVDA register 33 is provided to realize the eighth mechanism described above. This MVDA register 33 is used to store the necessary address of the moving destination when the signal mode_op read from the mode setting register 9 is "11" and indicates the M mode.

The MVS register 34 is provided to realize and validate the eighth mechanism described above. This MVS register 34 is used to set the amount of data to be copied in the mover function.

The SAR register 39 is provided to realize and validate the first through fourth mechanisms described above. This SAR register 39 is provided to set the amount of stride of the stride function, that is, the address interval size for every execution of one stride.

The SLR register 40 is provided to realize and validate the first through fourth mechanisms described above. The SLR register 40 is used to set the number of strides of the stride function.

The data size register 46 is used to set the data size of one DMA.

The DATA register 48 is used to store the write data (that becomes the base) when the signal mode_op read from the mode setting register 9 is "00" or "10", and to store the read data when the signal mode_op read from the mode setting register 9 is "11".

The registers 31 through 34, 39, 40, 46 and 48 shown in FIG. 4 can be set by software of the CPU 1, and need to be set prior to the execution of the load test. Hence, these registers 31 through 34, 39, 40, 46 and 48 are different from the registers to which it is essential to make the settings depending on each operation mode and mechanism (or function).

The signal mode_op indicating the operation mode and read from the mode setting register 9 is delivered to the data selecting circuit 19, the mode selecting circuit 21, the address selecting circuit 23, the address status circuit 25 and the comparing circuit 54. A signal status_change indicating whether or not a status change exists and output from the status change judging circuit 11 is delivered to the mode selecting circuit 21, the address selecting circuit 23 and the address status circuit 25. A signal stride_valid indicating whether or not the stride is valid and output from the stride valid register 13 is delivered to the data selecting circuit 19, the address selecting circuit 23 and the address status circuit 25. A signal data_sel, which selects data and is output from the data selecting circuit 19, is delivered to the data selector 50. A signal toggle_valid indicating whether or not the toggle is valid and output from the toggle valid register 15 is delivered to the data inversion judging circuit 17, and a signal toggle_sel output from the data inversion judging circuit 17 is delivered to the XOR 51. A signal toggle_change indicating whether or not the toggle change exists and output from the address status circuit 25 is also delivered to the data inversion judging circuit 17. A signal out_data, which is the output data of the XOR, is output to the bus interface unit 56 and is also delivered to the comparing circuit 54. A signal in_data, which is the input data from the bus interface unit 56, is input to the comparing circuit 54.

A signal bus_cmd, which is the bus command output from the mode selecting circuit 21, is output to the bus interface unit 56. A signal badr_sel, which selects the base address and is output from the address selecting circuit 23, is delivered to the base address selector 43. A signal adr_sel, which selects the address and is output from the address selecting circuit 23, is delivered to the address selector 45. A signal adr, which indicates the address and is output from the address selector 45, is output to the bus interface unit 56 and is also delivered to the XOR 49. A signal mv_end indicating the end of the mover function and output from the address status circuit 25 is output to the bus interface unit 56, a signal stride_next indicating the next stride and output from the address status circuit 25 is delivered to the stride counting circuit 42, and a signal mv_next indicating the next mover function and output from the address status circuit 25 is delivered to the data counting circuit 36. In addition, a signal stride_finish, which indicates the end of the stride and is output from the stride counting circuit 42, is delivered to the address status circuit 25. A signal mv_finish, which indicates the end of the mover function and is output from the data counting circuit 36, is delivered to the address status circuit 25. The output of the data size register 46 is delivered to the multiplier 35 and is also output to the bus interface unit 56.

Figure 5A:
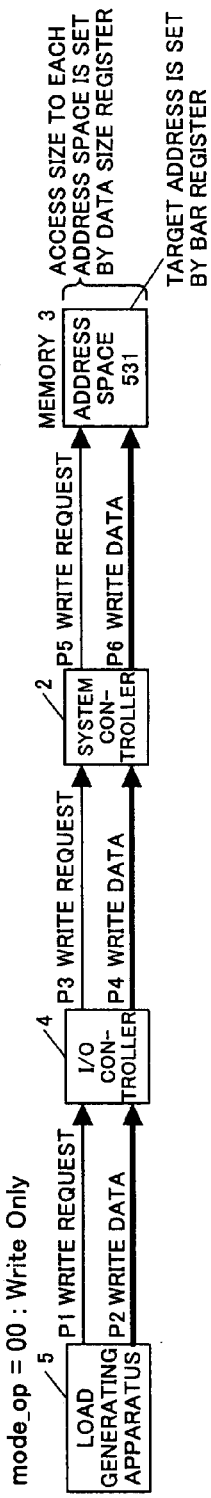
FIGS. 5A through 5D are diagrams for explaining access sequences with respect to a memory space in various operation modes of the load generating apparatus.
Figure 5B:
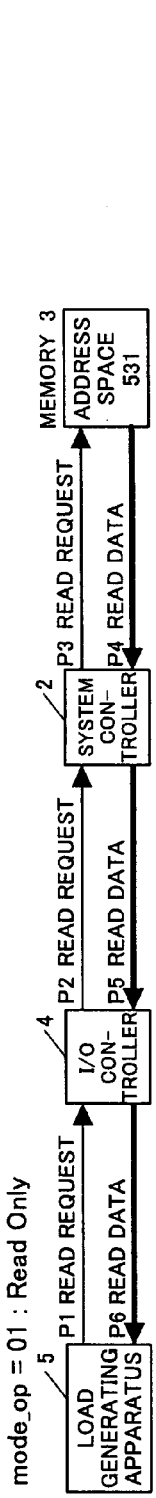
Figure 5C:
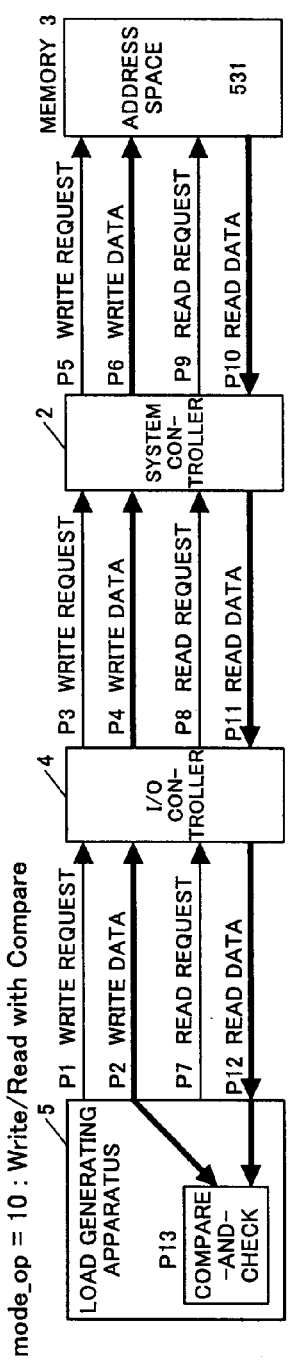
Figure 5D:
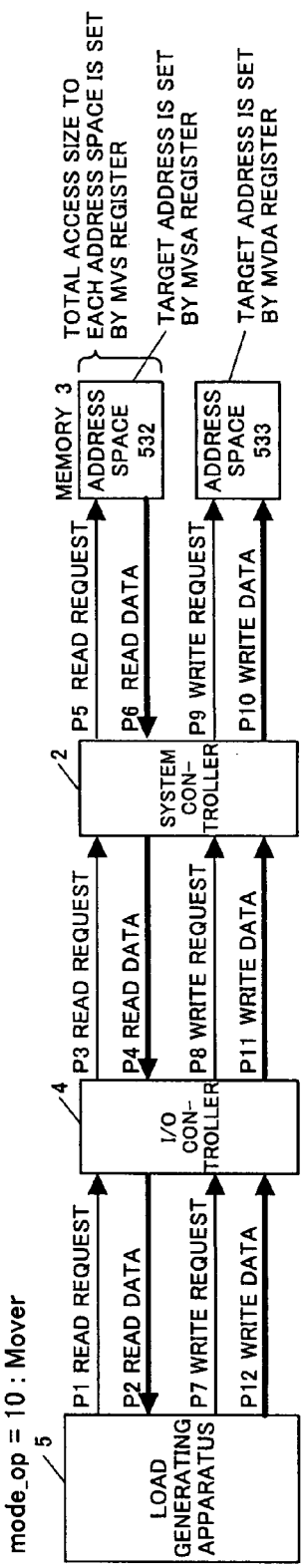

FIGS. 5A through 5D are diagrams for explaining access sequences with respect to the memory space in various operation modes of the load generating apparatus 5. FIG. 5A shows the access sequence in the WO mode, FIG. 5B shows the access sequence in the RO mode, FIG. 5C shows the access sequence in the WRC mode, and FIG. 5D shows the access sequence in the M mode. In FIGS. 5A through 5D, P1 through P10 indicate the sequence of the process.

In each of the WO, RO and WRC modes shown in FIGS. 5A through 5C, the access is made with respect to the same address, and in the M mode shown in FIG. 5D, the data copy from an address 532 to an address 533 is executed. Further, in FIG. 5D, the amount of data to be copied in the M mode is determined by the MVS register 34 shown in FIG. 4, and the data copy size realized by the access shown in FIG. 5D is determined by the data size register 46 shown in FIG. 4. In this embodiment, the data size that can be set in the MVS register 34 is larger than the value that can be set in the data size register 46, and the relationship of the following formula (1) stands. The number of accesses shown in FIG. 5D (that is, the number of times the series of operations shown in FIG. 5D is to be carried out) is controlled by the data counting circuit 36.

(Data Size of MVS Register 34)=(Data Size of Data Size Register 46)×(Number of Accesses Shown in FIG. 5D)         (1)

In this embodiment, the start and end of the operation of the load generating apparatus 5 is controlled by the software of the CPU 1 for the RO mode, the WO mode and the WRC mode. Once the operation of the load generating apparatus 5 is started, the operation of the load generating apparatus 5 continues independently of the software of the CPU 1 until the software of the CPU 1 carries out a control to end the operation.

FIGS. 6A, 6B and 6C respectively are diagrams for explaining memory access operations for the first, fourth and fifth mechanisms described above. FIG. 6A shows a case where the value of the SAR register 39 is larger than the value of the data size register 46, FIG. 6B shows a case where the value of the SAR register 39 is equal to the value of the data size register 46, and FIG. 6C shows a case where the value of the SAR register 39 is smaller than the value of the data size register 46. For the sake of convenience, it is assumed that the number of strides, that is, the value of the SLR register 40 shown in FIG. 4, is set to "4", and the BAR register 31 shown in FIG. 4 is used for the target base address, that is, the address space 531 which is the first access target indicated by P1.

According to this setting, the access is first made to the address space 531 as indicated by P1 in each of the operation modes WO, RO and WRC. Then, in the same operation mode, accesses are made to the address spaces 532, 533 and 534 as indicated by P2, P3 and P4. When the number of strides becomes 4, the access indicated by P1 is made again as indicated by P5. Hence, until the end of the operation of the load generating apparatus 5 is controlled by the software of the CPU 1, the access operations indicated by P1 through P5 are continued. In the M mode which will be described later, the MVSA register 32 and the MVDA register 33 are used for the base address.

The target addresses of the access operations shown in FIGS. 6A through 6C may be replaced by the following formula (2) in the circuit shown in FIG. 4.

(Target Address)={Base Address (BAR Register 31 or MVSA Register 21 or MVDA Register 33)}+(SAR register 39)+(SLR Register 40)         (2)

The address of the SAR register 39 directly becomes the amount of change to the next target address. Hence, the accesses shown in FIGS. 6A through 6C can be realized by the different differences between the data size that is accessed and the amount of change that is indicated by the value of the SAR register 39.

The operation shown in FIG. 6A mainly targets the cache WAY of the CPU 1 of the test target system 100. The access in this case has access intervals of MB units. In addition, the value of the data size register 46 shown in FIG. 4 is the data size in one DMA operation, and is in KB units. Since the amount of change of the address is larger than the data size that is accessed, the address spaces of the memory 3 are accessed at intervals as shown in FIG. 6A.

In the operation shown in FIG. 6B, the data size that is accessed matches the amount of change of the address, and thus, it appears as if the address spaces of the memory 3 are continuously accessed. For example, even in the case of the memory 3 of the GB to TB unit order, it is possible to easily carry out this operation by increasing the value of the SLR register 40, that is, the number of strides.

In the operation shown in FIG. 6C, the amount of change of the address is smaller than the data size that is accessed, and thus, it appears as if the address spaces of the memory 3 are accessed by slightly shifting the address.

Therefore, according to the load generating apparatus 5 of this embodiment, it is possible to create three different access patterns by simply determining the values of two registers.

Figure 7:
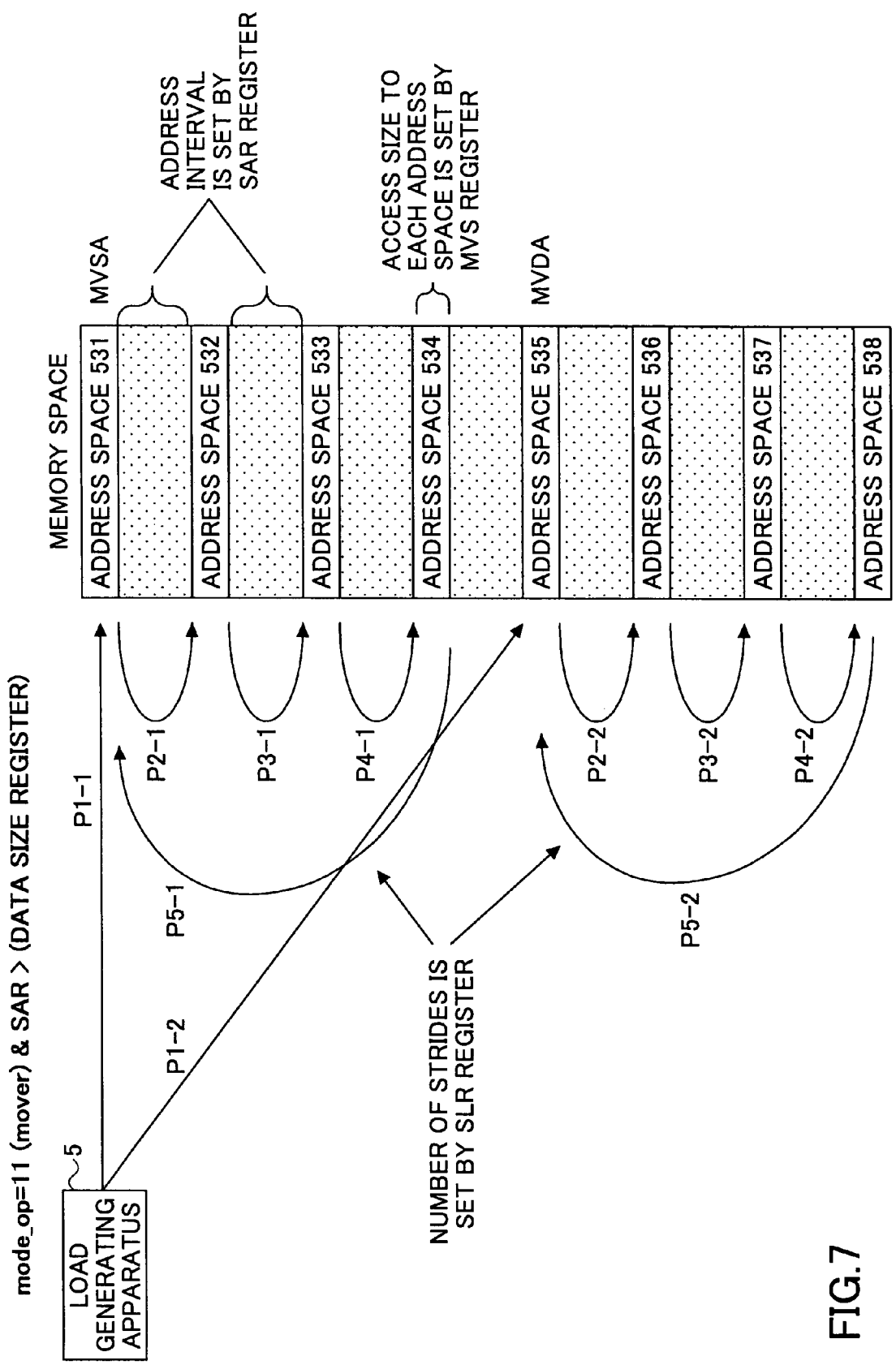
FIG. 7 is a diagram for explaining a memory access operation for a twelfth mechanism.

FIG. 7 is a diagram for explaining a memory access operation for the twelfth mechanism described above. For the sake of convenience, it is assumed that the number of strides, that is, the value of the SLR register 40 shown in FIG. 4, is set to "4". Since the operation mode is the M mode, it is further assumed that for the target base addresses, the MVSA register 32 shown in FIG. 4 is used for the address space 531 that is the moving source target of the first access indicated by P1-1, and the MVDA register 33 shown in FIG. 4 is used for the address space 535 that is the moving destination target of the first access indicated by P2-1.

The accesses are made in the sequence P1-1, P1-2, P2-1, P2-2, P3-1, P3-2, P4-1 and P4-2. Because the number of slides is set to "4", after the access indicated by P4-2 ends, the access returns to the first access as indicated by P5-1 and P5-2, that is, returns to the access indicated by P1-1 and P1-2, and the operation continues. The data copy is made within each of P1, P2, P3 and P4.

The thirteenth mechanism can carry out the memory copy in GB to TB unit order by the address specifying method of FIG. 6B and the operation of FIG. 7, solely by the load generating apparatus 5, without requiring the software control of the CPU 1.

The fourteenth mechanism can realize a unique pattern such as copying while shifting the address boundary by the load generating apparatus 5, by the address specifying method of FIG. 6C and the operation of FIG. 7, solely from the combination of the register settings, without requiring the software control of the CPU 1.

For the data conversion function, it is undesirable, also from the point of view of increasing the load, to write the same data pattern with respect to the same or different addresses. In addition, when the same data pattern is used, it may become difficult to carry out the debugging when a problem is generated in the test target system 100. For these reasons, the load generating apparatus 5 is provided with a function of not continuously writing the same data according to the sixth mechanism described above, and is provided with a function of writing the unique data to each load target address (that is, the access target address) according to the second, third and ninth through eleventh mechanisms described above.

Figure 8A:
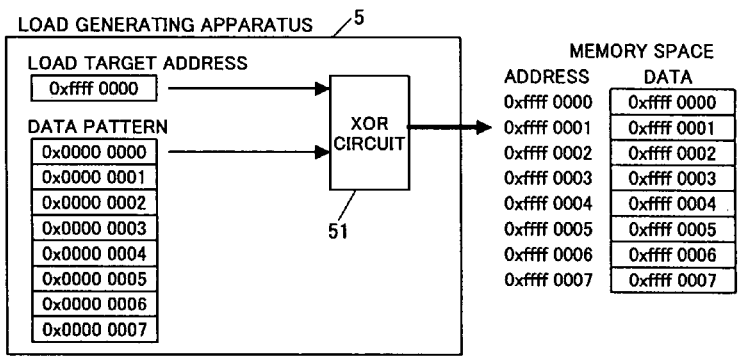
FIGS. 8A through 8C are diagrams generally showing second, sixth and ninth mechanisms.
Figure 8B:
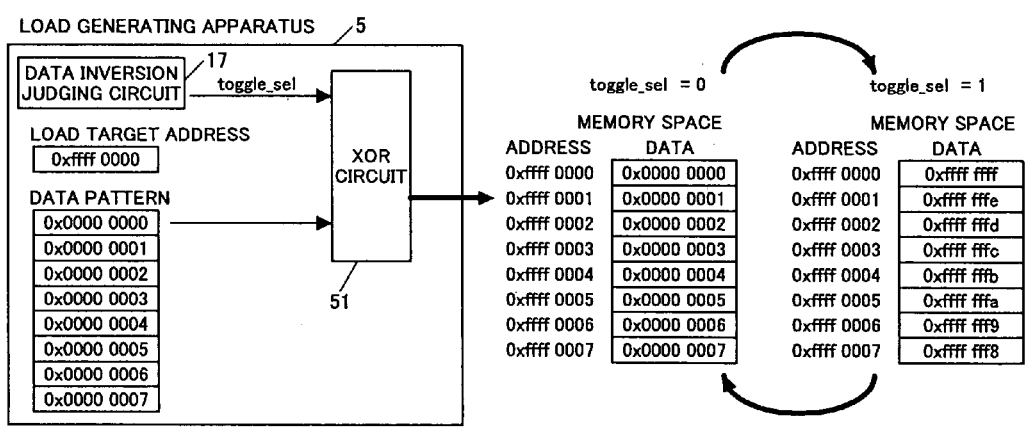
Figure 8C:
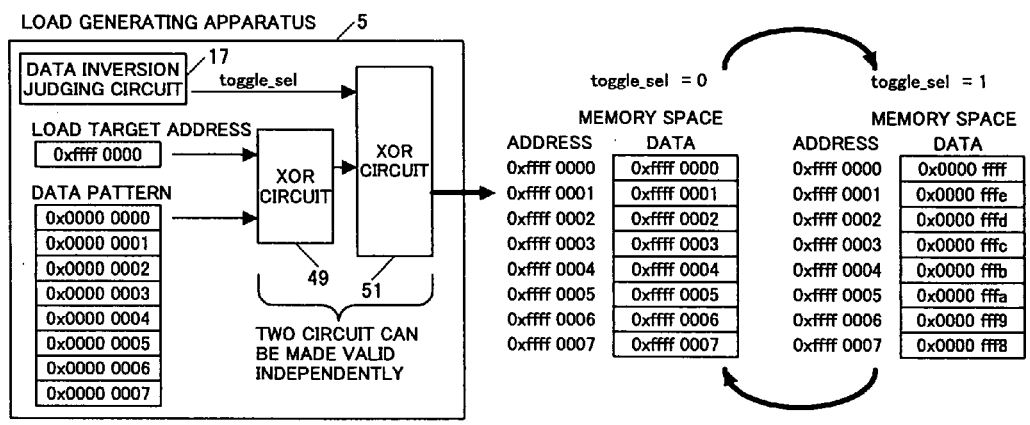

FIGS. 8A through 8C are diagrams generally showing the second, sixth and ninth mechanisms described above. In this embodiment, the load generating apparatus 5 is implemented with respect to a 64-bit PCI-X bus, for example. Hence, it is assumed that a 64-byte DMA write is carried out in FIGS. 8A through 8C. It is assumed that the load target address in this case is "0xffff 0000", and 8 64-bit data from "0x0" to "0x7" are stored in the DATA register 48 shown in FIG. 4.

FIG. 8A shows the data pattern conversion function of the second mechanism described above. In this case, by carrying out an exclusive-OR (XOR) operation between the data stored in the DATA register 48 and the load target address to which the data is to be written, it is possible to regenerate the data pattern for every address. In addition, by using the stride function of the first mechanism described above together with the second mechanism, it is possible to write a unique data for every load target address which became the target of the stride, while keeping the data pattern of the DATA register 48 fixed. In other words, as long as the minimum data pattern amounting to the transferable data size of the DMA is prepared, it means that the unique data can be written with respect to all addresses within the range of the stridable memory space. Furthermore, when the target address generating method indicated by the formula (2) described above is used, the stride is valid when "0" is set in the SLR register 40, but similarly to the case where the stride is invalid, it is possible to make only a single address the load target, and also make the data pattern the data pattern that is obtained by the XOR operation with the load target address.

FIG. 8B shows the data pattern conversion function of the sixth mechanism described above. In this case, when carrying out the DMA write with respect to the same address, an XOR operation is carried out between the signal toggle_sel that is generated by the data inversion judging circuit 17 and the data pattern, so as not to write the same data continuously.

FIG. 8C shows the data pattern conversion function of the ninth mechanism described above. In this case, the test pattern can be realized by combining the second, third and sixth mechanisms described above. As shown in FIG. 9, the switching timing of the signal toggle_sel and the timing of P5, that is, the reexecution timing from the first address of the stride, are the same. FIG. 9 is a diagram showing the switching timing of the signal toggle_sel by the ninth mechanism.

FIG. 10 is a table showing address selecting conditions of the signals adr_sel and base_sel in various operation modes of the load generating apparatus 5. If the operation mode is other than the M mode, basically, the value of the BAR register 31 is used as it is or, a result of an address operation is used, depending on whether the stride valid register 13 is ON or OFF. But since the ON or OFF of the stride valid register 13 is determined prior to the load generation, the address register selected based on the signals adr_sel and badr_sel during the load generation is fixed. In the case of the M mode, it is necessary to alternately output the addresses of the copy source and the copy destination, and thus, when the issuance of the signal status_change, that is, the previous transaction ends, the other address is selected as the address to be output. Accordingly, the address operation result is always selected when the stride valid register 13 is ON. This is an essential selecting condition when only the second mechanism and not the third mechanism is realized using the related registers of the stride function.

FIG. 11 is a table showing selecting conditions of the output data of the DATA register 48 in various operation modes of the load generating apparatus 5. If the operation mode is the M mode, always only the output data of the DATA register 48 is selected. Although the RO mode is included in the selecting condition, this is not valid.

FIG. 12 is a table showing issue timing conditions of the signal toggle_change in various operation modes of the load generating apparatus 5. Basically, the stride valid register 13 is OFF, and when the stride valid register 13 is ON conditions are added to the conditions at the time when the stride valid register 13 is OFF. However, in the M mode, the signal toggle_change is not issued always. By combining the conditions at the time of the M mode shown in FIG. 11 and the conditions at the time of the M mode shown in FIG. 12, it is possible to suppress the generation of the data pattern as in the case of the fifteenth mechanism described above.

Next, a description will be given of the operation in the various operation modes of the load generating apparatus 5, by referring to flowcharts of FIGS. 13 through 21. The preconditions of the operation of the load generating apparatus 5 are that, initial values of each of the operation units and the counted values are all "0", and that results of each of the resources are updated depending on the operation mode. Furthermore, it is also a precondition that, when the operation is ended by the software of the CPU 1 or the like, all of the resources are initialized. When carrying out each operation, it is necessary to set in advance the signal mode_op and the registers described with reference to the flow charts, prior to executing the operation. In the following description of the flowcharts, steps shown in FIGS. 13 through 21 that are related to the described processes are indicated in brackets.

Figure 13:
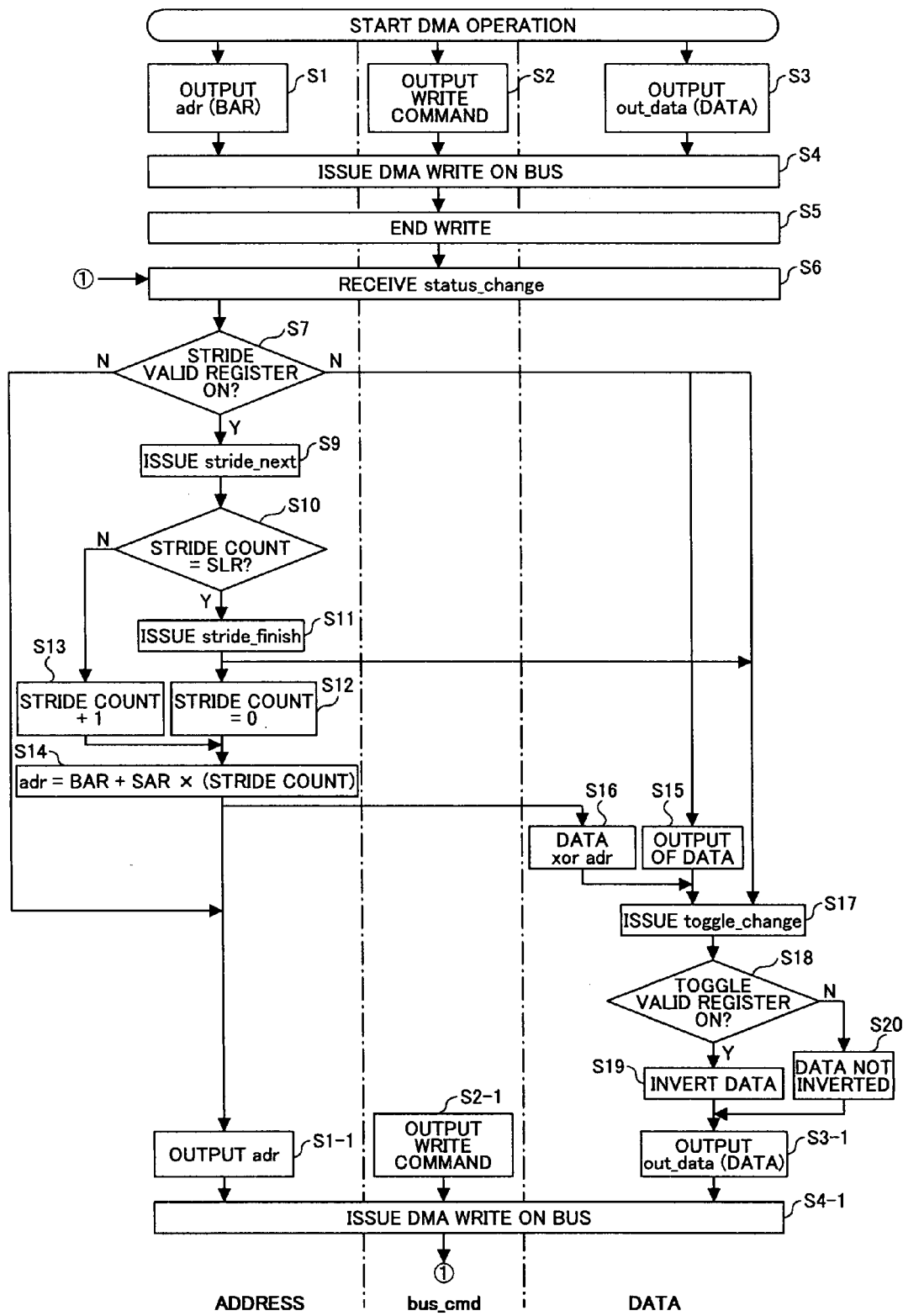
FIG. 13 is a flow chart for explaining an operation of the load generating apparatus in a WO mode.

FIG. 13 is a flow chart for explaining the operation of the load generating apparatus 5 in the WO mode (signal mode_op=00). In FIG. 13, when the DMA operation is started after the setting of the registers ends, the address and write data set in the registers are first used (steps S1 to S3) to issue a DMA write (command) on the I/O bus 104 (step S4). Responsive to the end of transaction of the DMA write on the I/O bus 104 (step S5), the status change judging circuit 11 receives a transaction complete notification from the bus interface unit 56 and issues the signal status_change (step S6). If the stride valid register 13 is OFF (NO in step S7), the address remains to be the value of the BAR address register 31, and the address for the next DMA write is output to the bus interface unit 56 (step S1-1). If the stride valid register 13 is ON (YES in step S7), the address status circuit 25 issues the signal stride_next (step S9). Responsive to the issuance of the signal stride_next, the stride counting circuit 42 compares the number of strides set in the SLR register 40 and the present counted value (step S10), if the compared values match (YES in step S10), sends the signal stride_finish to the address status circuit 25 (step S11) and initializes the counted value of the stride counting circuit 42 to "0" (step S12). If the number of strides set in the SLR register 40 and the present counted value do not match (NO in step S10), the present counted value of the stride counting circuit 42 is incremented by "1" (step S13), and the counted value of the stride counting circuit 42 is delivered to the multiplier 41. The multiplier 41 computes the formula (2) described above based on the value of the BAR register 31, the value of the SAR register 39 and the counted value of the stride counting circuit 42 (step S14), and outputs the address for the next DMA write (step S1-1).

With regard to the data output, if the stride valid register 13 is OFF (NO in step S7), the data stored in the DATA register 48 is used as it is (step S15). On the other hand, if the stride valid register 13 is ON (YES in step S7), the previous address computation (or multiplication) result is used (step S16). The signal toggle_change for inverting the data so as not to write the same data continuously to the same address thereafter, is issued by the address status circuit 25 by carrying out a condition judgement (step S17). This condition judgement is always carried out in response to the issuance of the signal status_change if the stride is invalid, and issues the signal toggle_change only if the stride is valid and the counted value of the stride counting circuit 42 matches the value of the SLR register 40. This is because, as described above in conjunction with process flow of the address output, if the stride is invalid, the address that is issued next is the same as the previous address, and the condition is such that the signal toggle_change is issued in response to the issuance of the signal status_change, whereas if the stride is valid, the counted value becomes "0" when the counted value of the stride counting circuit 42 matches the value of the SLR register 40, and the address in this state returns to the first issued address due to the formula (2) described above. Accordingly, if the stride is valid, the condition is such that the signal toggle_change is issued when the signal stride_finish is received. The data inversion judging circuit 17 receives the issued signal toggle_change, and determines whether to invert the data (step S19) or not to invert the data (step S20) depending on whether the toggle valid register 13 is ON (YES in step S18) or OFF (NO in step S18), and sends the data to the bus interface unit 56 (step S3-1). Thereafter, the address and the write data that are set in the registers with respect to the next DMA write are used (steps S1-1 to S3-1), and a DMA write (command) is issued on the I/O bus 104 (step S4-1), similarly to the process described above. The operation described above continues to be executed unless ended by the software of the CPU 1 or, an error is generated on the I/O bus 104.

Figure 14:
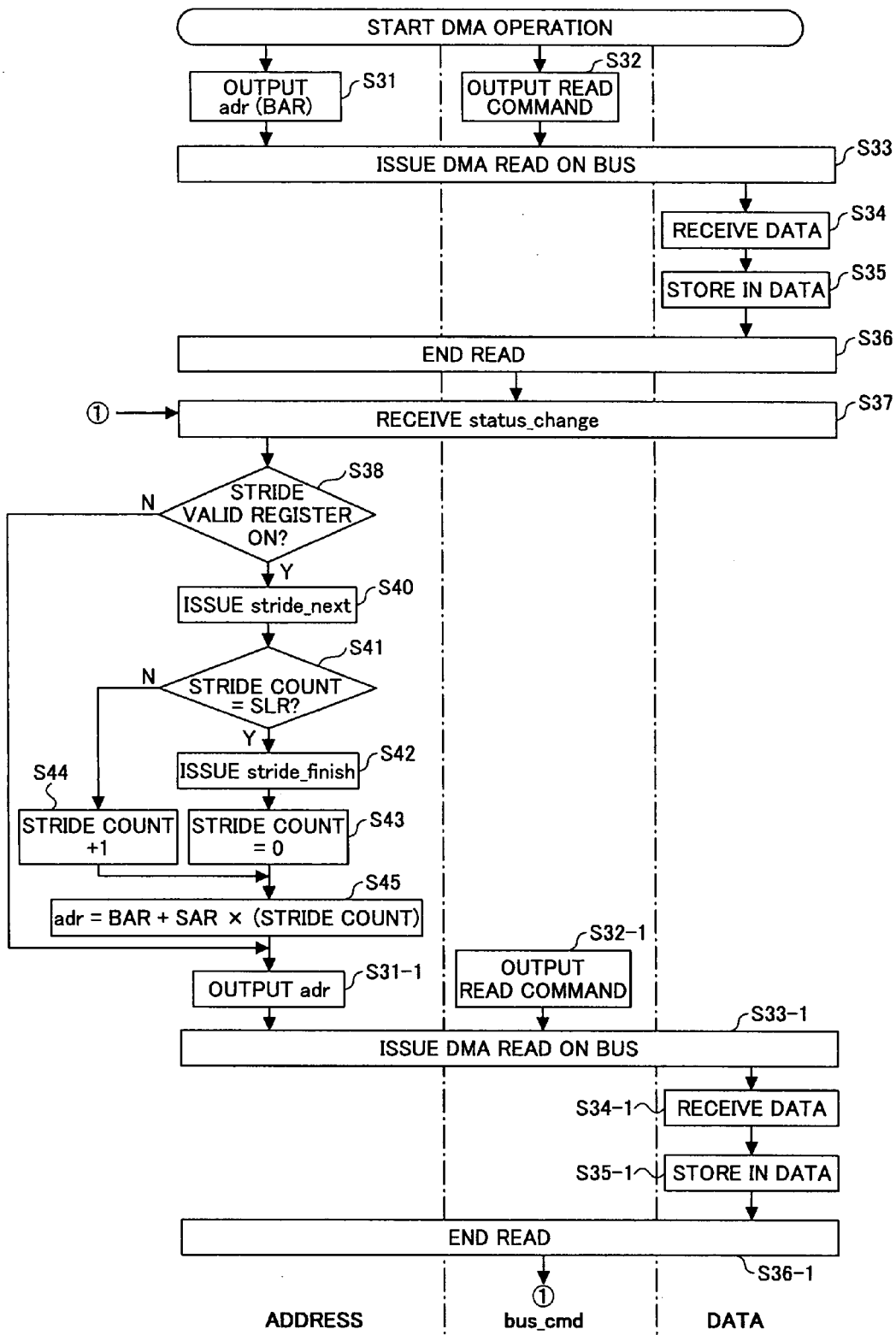
FIG. 14 is a flow chart for explaining an operation of the load generating apparatus in an RO mode.

FIG. 14 is a flow chart for explaining the operation of the load generating apparatus 5 in the RO mode (signal mode_op=01). In FIG. 14, when the DMA operation is started after the setting of the registers ends, the address set in the register is first used (steps S31 and S32) to issue a DMA read (command) on the I/O bus 104 (step S33). When the read data is received (step S34), the received read data is stored in a region of the DATA register 48 (step S35). This is because, in the case of the read only, the load generating apparatus 5 by itself cannot judge whether or not the read data is correct, and the read data is stored in the DATA register 48 that is not used in the RO mode so that the read data can be checked by the software of the CPU 1. When all of the read data are received and stored in the DATA register 48 and the DMA read ends (step S36), the status change judging circuit 11 issues the signal status_change in response to a transaction complete notification from the bus interface unit 56 (step S36). In the RO mode, when the signal status_change is issued and the stride valid register 13 is ON (YES in step S38), the address computation is carried out (steps S40 to S45), similarly to the case of the WO mode. This address computation is the same as the address computation (steps S9 to S14) carried out in the WO mode. In addition, similarly to the case of the WO mode, the operation in the RO mode described above continues to be executed unless ended by the software of the CPU 1 or, an error is generated on the I/O bus 104.

Figure 15:
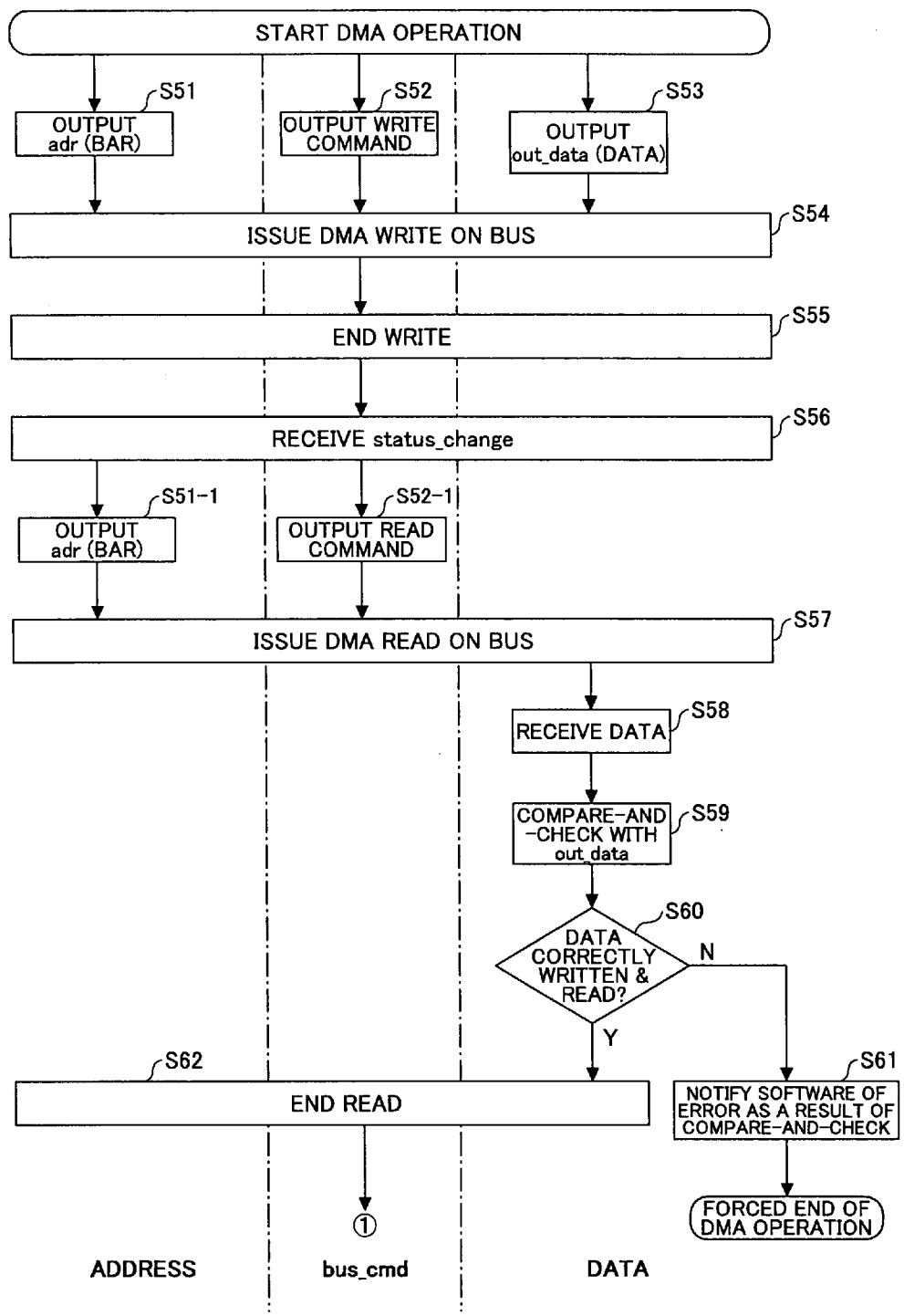
FIG. 15 is a flow chart for explaining an operation of the load generating apparatus in a WRC mode.
Figure 16:
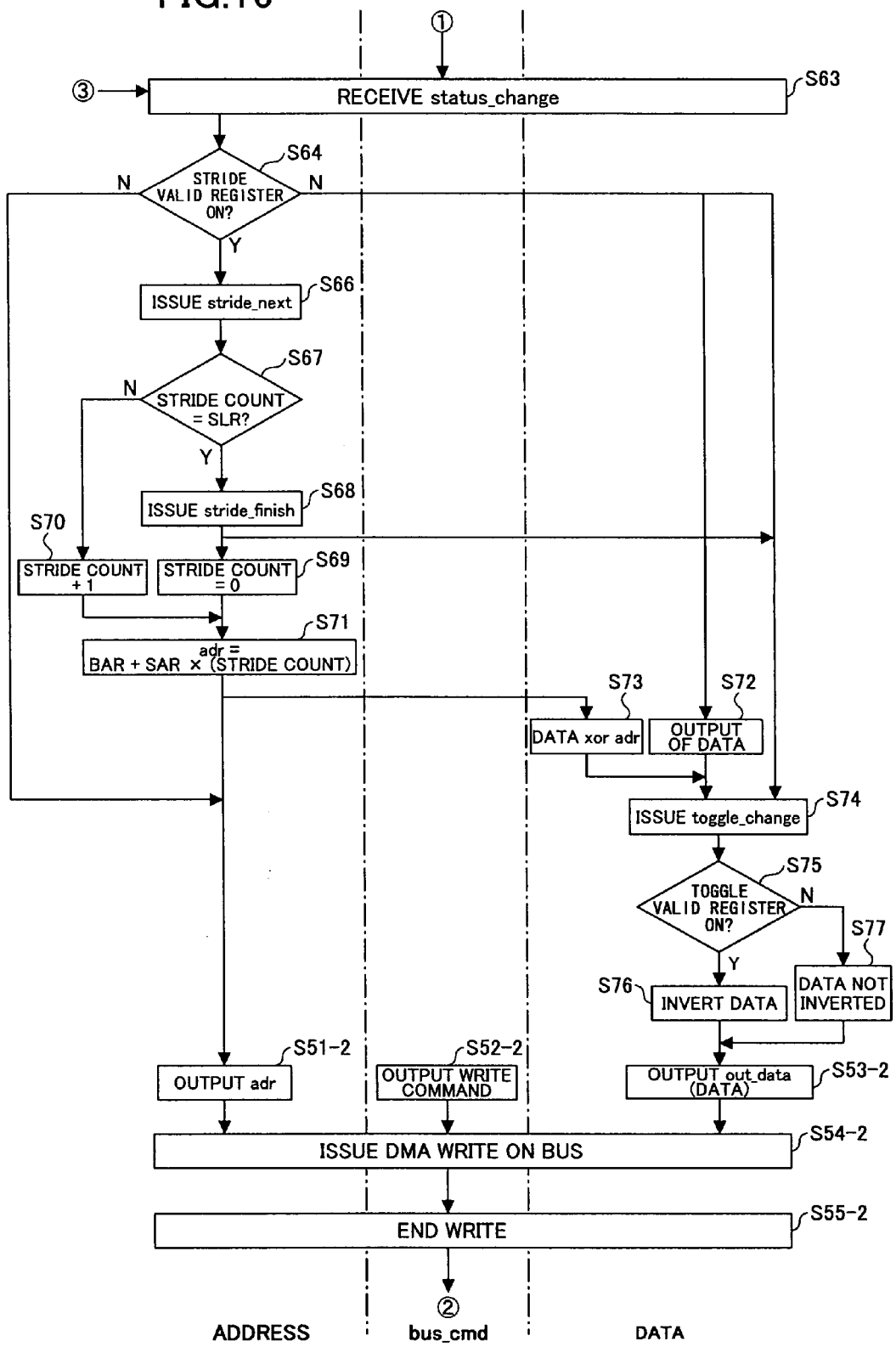
FIG. 16 is a continuation of the flow chart for explaining the operation of the load generating apparatus in the WRC mode.
Figure 17:
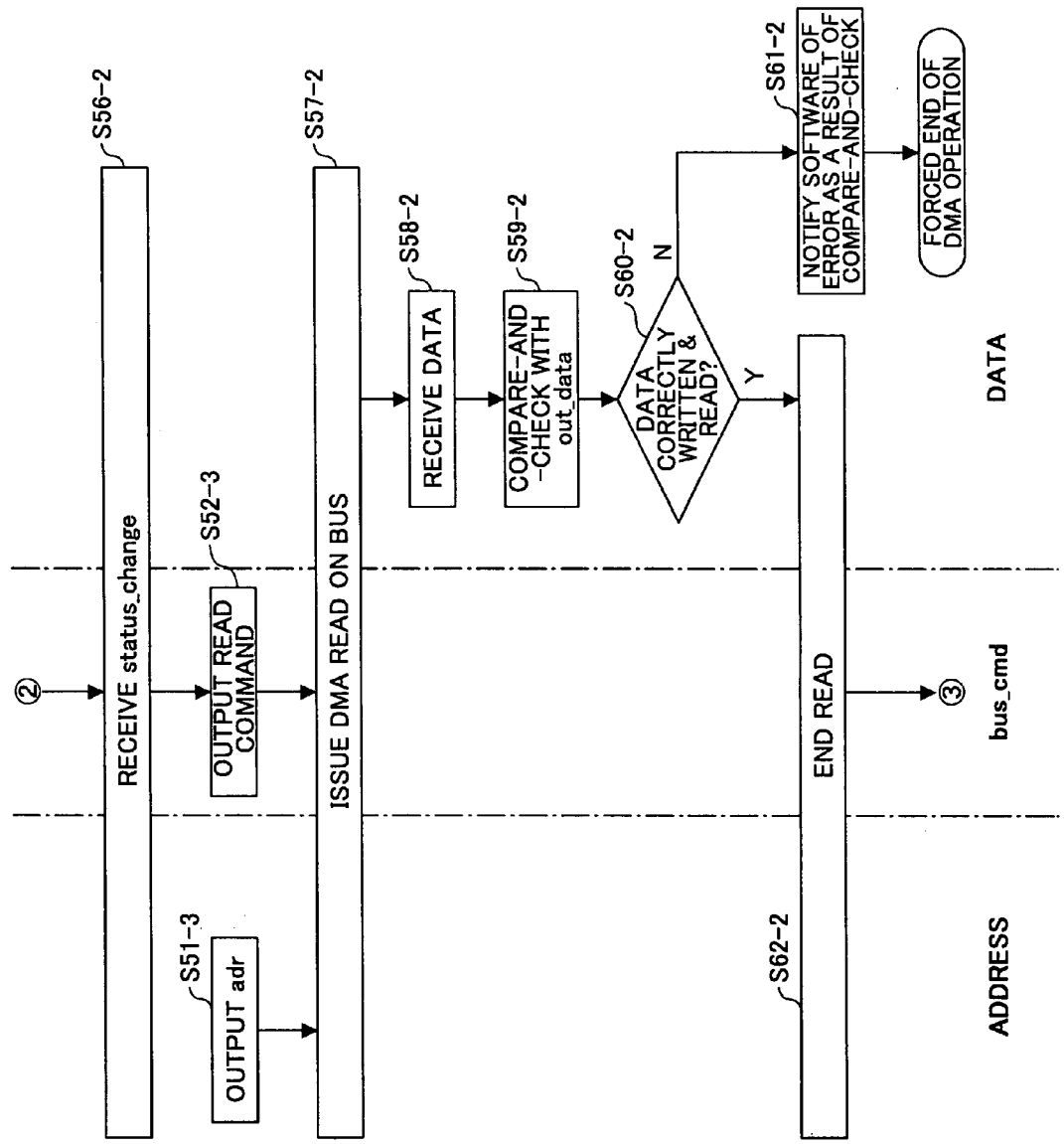
FIG. 17 is a continuation of the flow chart for explaining the operation of the load generating apparatus in the WRC mode.

FIGS. 15 through 17 are flow charts for explaining the operation of the load generating apparatus 5 in the WRC mode (signal mode_op=10). In FIG. 15, when the DMA operation is started after the setting of the registers ends, the address and the write data set in the registers are first used (steps S51 to S53) to issue a DMA write (command) on the I/O bus 104 (step S54). When the DMA write ends (step S55), the status change judging circuit 11 issues the signal status_change in response to a transaction complete notification from the bus interface unit 56 (step S56), and a DMA read is executed (steps S51-1, S52-1 and S59). In this state, only the bus command is changed by the signal status_change. Since the address is not changed, the operation which writes to and reads from the same address stands. In the WRC mode, the data received by the DMA read (step S58) is not stored in the DATA register 48, and a compare-and-check is made with the value of a signal out_data (step S59) to confirm whether or not the data was correctly written and read (step S60). The data that is compared with the received data is the result that is obtained by inverting the result of the XOR operation with the data address. If an error is generated as a result of the compare-and-check (NO in step S60), a notification is made to the software of the CPU 1 to notify the generation of the error as a result of the compare-and-check (step S61), and the operation is ended. On the other hand, if no error is generated as a result of the compare-and-check and no problem occurs (YES in step S60), the read is ended (step S62), and the signal status_change that is issued by the read end is used (step 63 in FIG. 16) to generate the next address and data. The method of generating the address and the data in this case may be the same as that used in the case of the WO mode described above in conjunction with FIG. 13. Since steps S63 to S54-2 shown in FIG. 16 are the same as the steps S6 to S4-1 shown in FIG. 13, a description thereof will be omitted. In addition, steps S56-2 to S62-2 shown in FIG. 17 after the write end (step S55-2) are the same as the steps S56 to S62 shown in FIG. 15, and a description thereof will be omitted. The operation in the WRC mode described above continues to be executed unless ended by the software of the CPU 1 or, an error is generated on the I/O bus 104.

Figure 18:
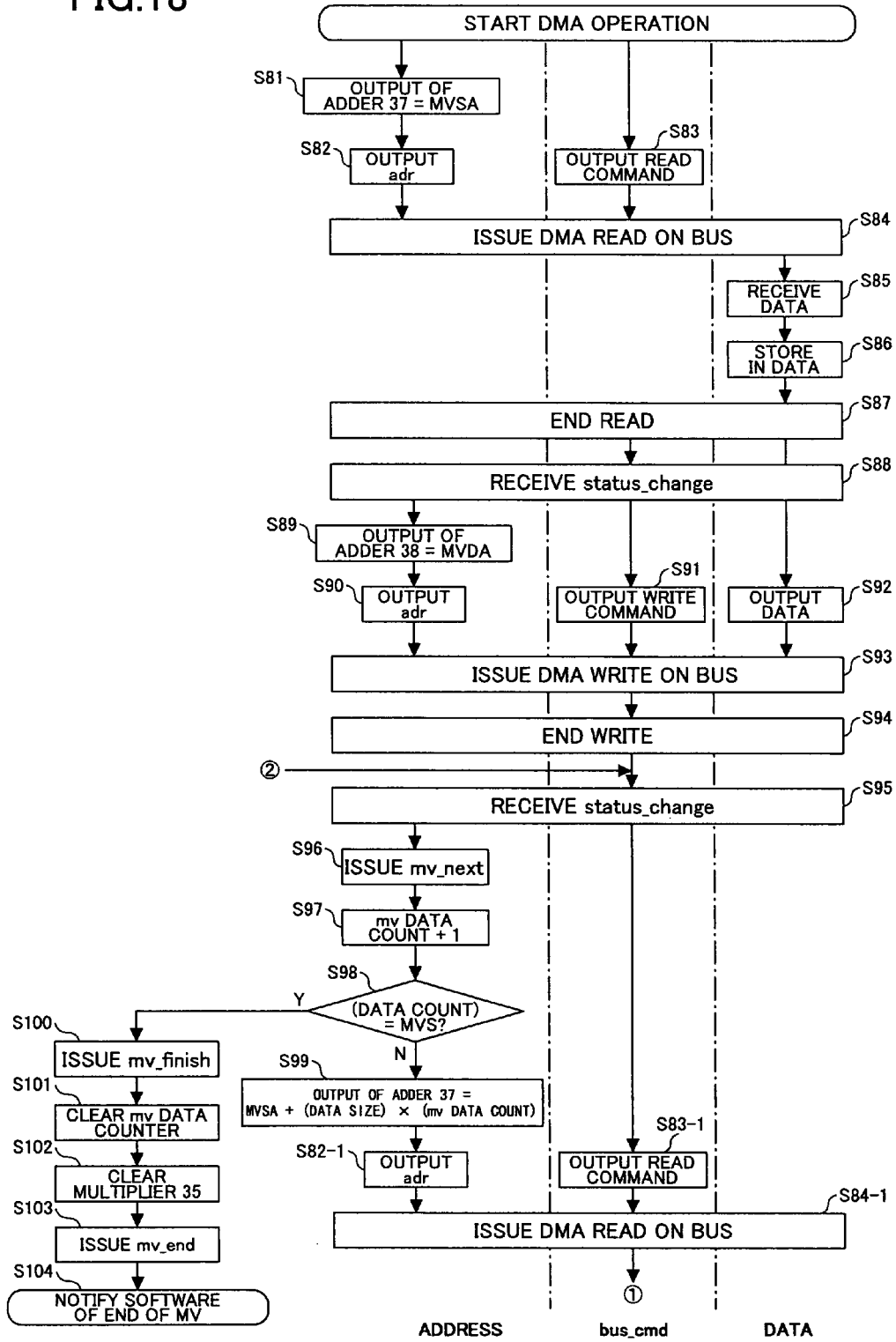
FIG. 18 is a flow chart for explaining an operation of the load generating apparatus in an M mode when a stride is invalid.
Figure 19:
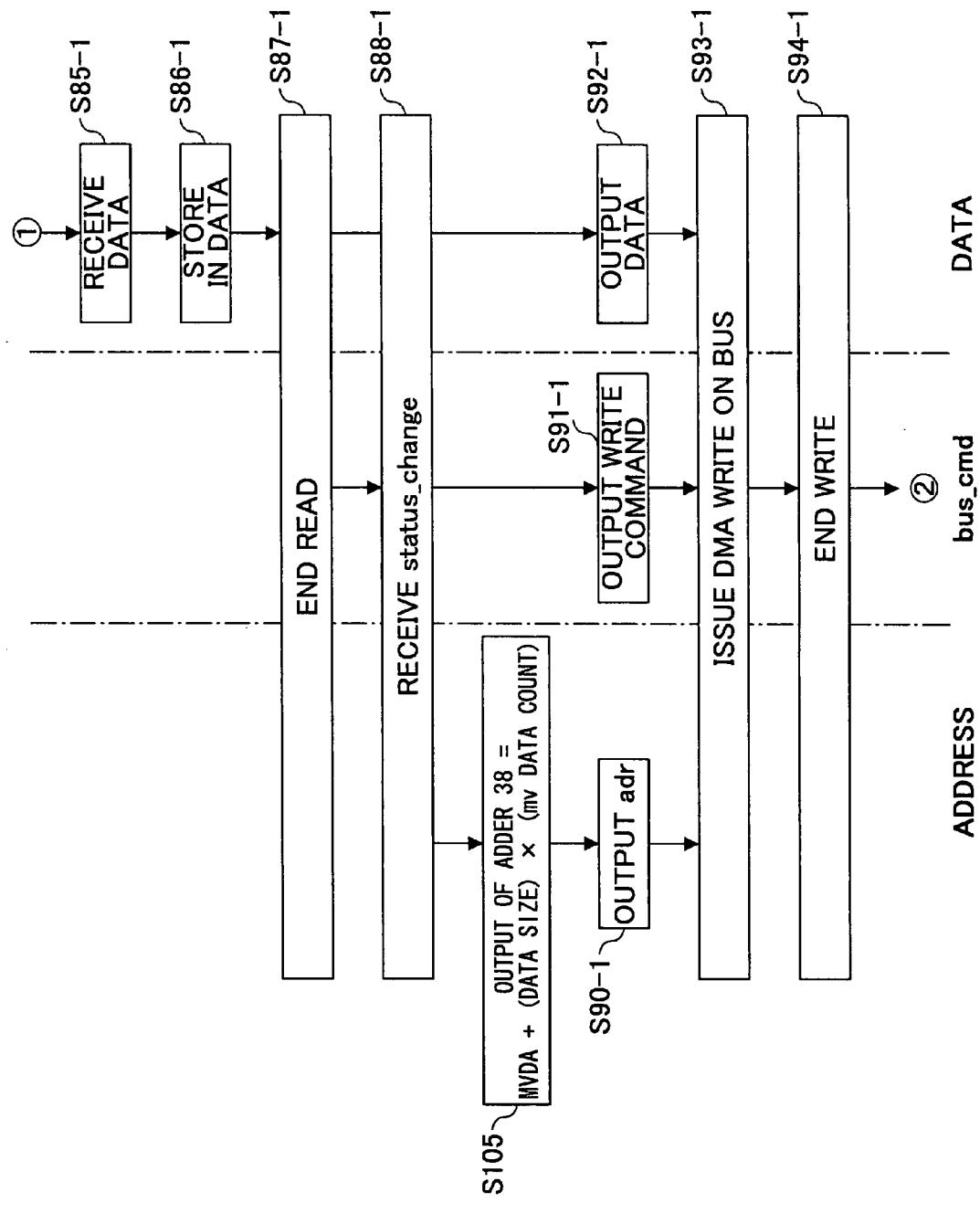
FIG. 19 is a continuation of the flow chart for explaining the operation of the load generating apparatus in the M mode when the stride is invalid.

FIGS. 18 and 19 are flow charts for explaining the operation of the load generating apparatus 5 in the M mode (signal mode_op=11) when the stride is invalid. In FIG. 18, when the DMA operation is started after the setting of the register ends (steps S81 to S83), the address set in the MVSA register 32 is used (step S81) to issue a DMA read (command) on the I/O bus 104. In this state, although the process passes via the address adder 37 in FIG. 4, the address is the same as the address set in the MVSA register 32 because the number of accesses indicated by the formula (1) described above is 0. When the read data is received (step S85), the received data is stored in a region of the DATA register 48 (step S86). When the DMA read ends (step S87), the status change judging circuit 11 issues the signal status_change (step S88). After the setting of the register ends (steps S89 to S92), the address set in the MVDA register 33 is used (step S89) to issue a DMA write (command) on the I/O bus 104 (step S93), so as to execute the DMA write with respect to the data received by the previous DMA read. In this state, the counted value of the data counting circuit 36, which indicates the number of accesses, is not yet updated, and the address is the same as the address set in the MVDA register 33. When the DMA write ends (step S94) and the issued signal status_change generated thereby is received (step S95), the address status circuit 25 issues a signal mv_next (step S96), and the counted value of the data counting circuit 36 is incremented by "1" (step S97), so as to compute the amount of memory copies executed up to the present according to the formula (1) described above and to compare it with the value of the MVS register 34 (step S98). If the amount of memory copies executed up to the present has not reached the amount of memory copies indicated by the MVS register 34 (NO in step S98), a product of the counted value of the data counting circuit 36 and the data size is computed, and the computed product is added to the value of the MVSA register 32 so that the added value is used as the address for the next memory copy (step S99). Of the steps subsequent to the step S99, those steps which are the same as the steps shown in FIGS. 18 and 19 described above are designated by the same reference numerals with a suffix "-1", and a description thereof will be omitted. In FIG. 19, a step S105 computes a product of the counted value of the data counting circuit 36 and the data size, and adds the computed product to the value of the MVDA register 33 so that the added value is used as the address for the next memory copy.

On the other hand, the amount of memory copies executed up to the present has reached and is equal to the amount of memory copies indicated by the MVS register 34 (YES in step S98), the data counting circuit 36 issues a signal mv_finish (step S100), and the address status circuit 25 clears the resources used by the mover function (or M mode), such as the data counting circuit 36 and the multiplier 35 (steps S101 and S102), and issues a signal mv_end with respect to the bus interface unit 56 (step S103). The bus interface unit 56 notifies the end of the mover function (or M mode) to the software of the CPU 1 when the signal mv_end is received (step S104).

Figure 20:
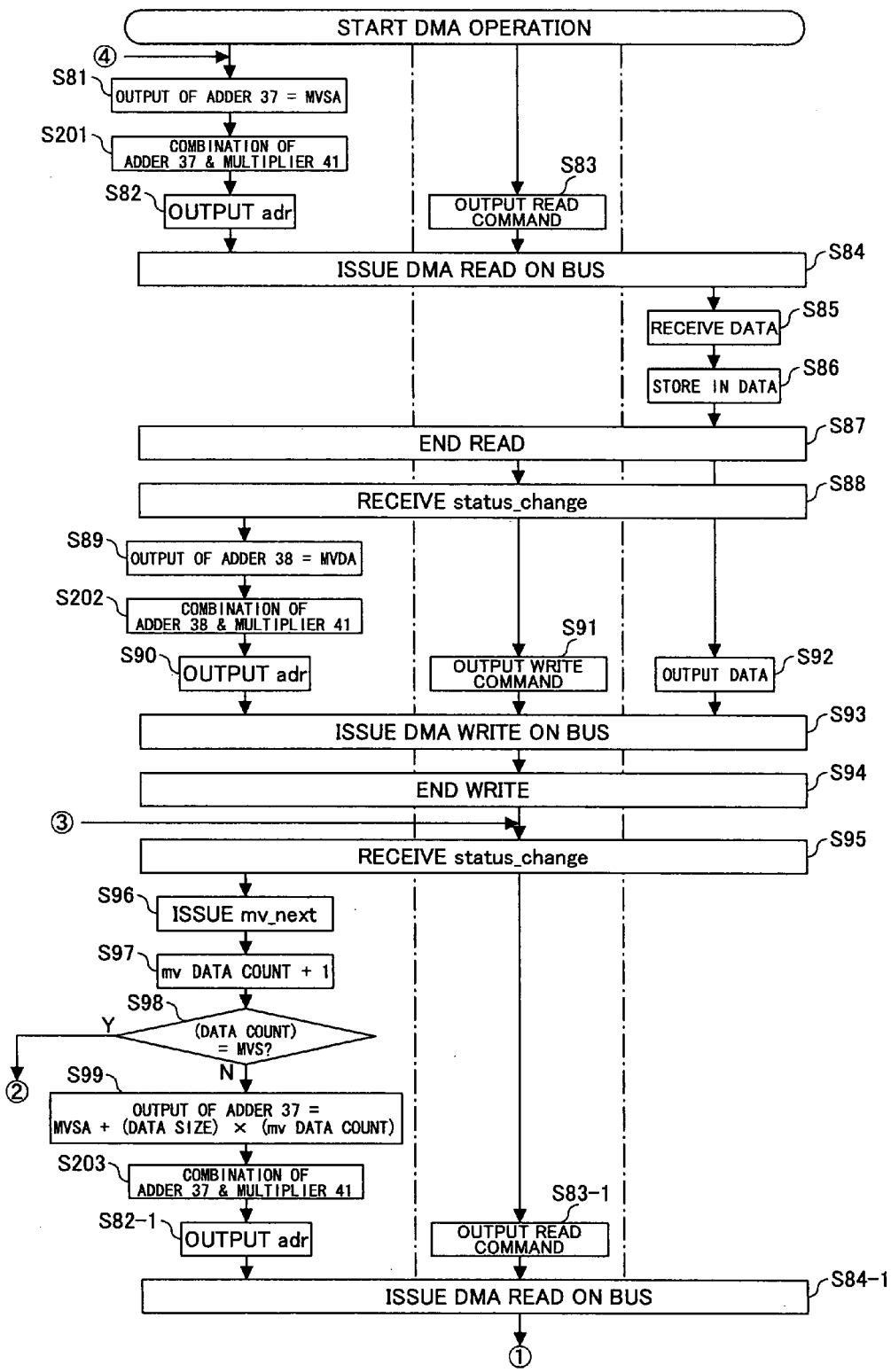
FIG. 20 is a flow chart for explaining an operation of the load generating apparatus in the M mode when the stride is valid.
Figure 21:
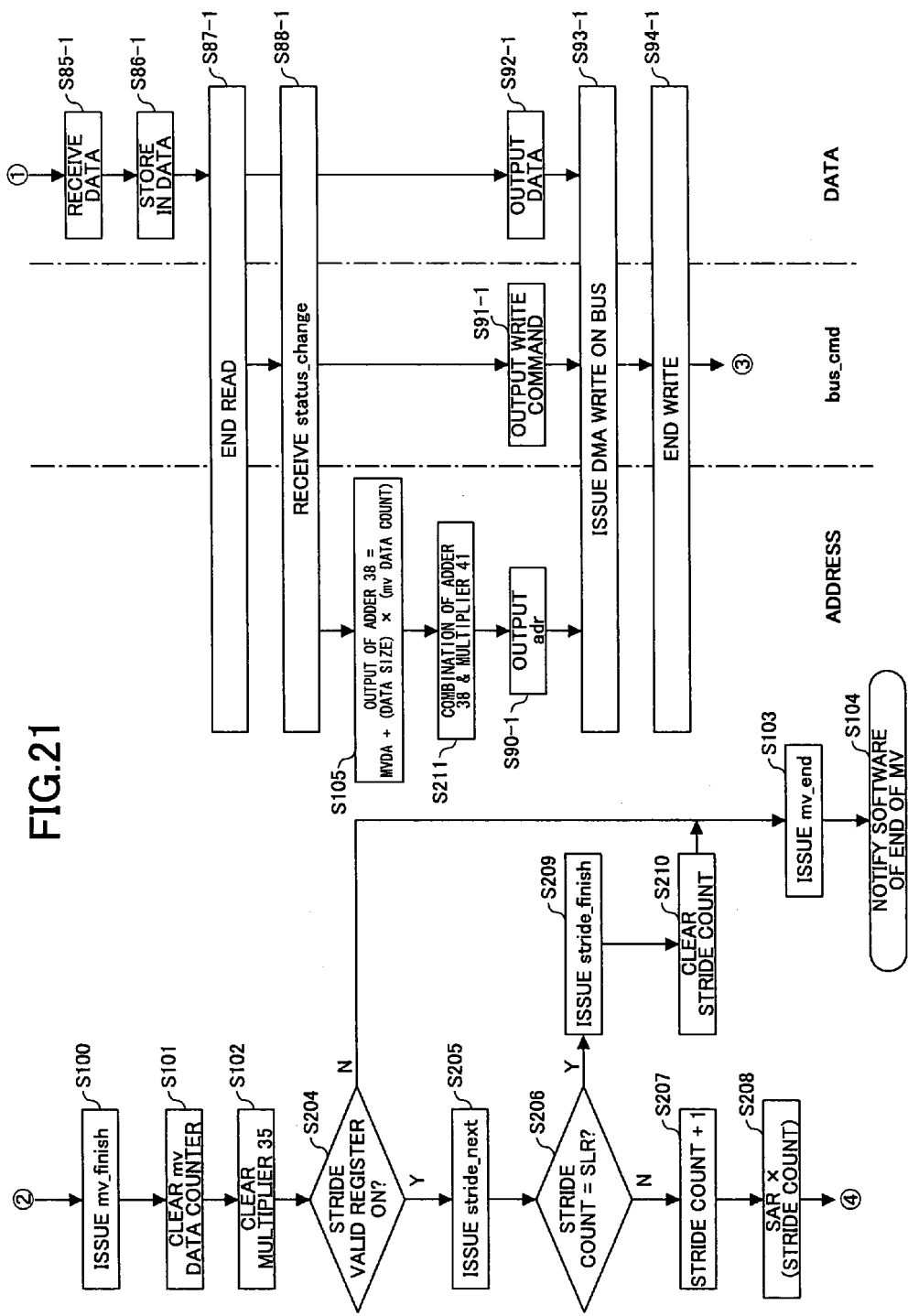
FIG. 21 is a continuation of the flow chart for explaining the operation of the load generating apparatus in the M mode when the stride is valid.

FIGS. 20 and 21 are flow charts for explaining the operation of the load generating apparatus 5 in the M mode (signal mode_op=11) when the stride is valid. In FIGS. 20 and 21, the basic operation is the same as that shown in FIGS. 18 and 19, except for the following two points. In FIGS. 20 and 21, those steps that are the same as those corresponding steps in FIGS. 18 and 19 are designated by the same reference numerals, and a description thereof will be omitted.

First, when generating the address, even if the mover function (or M mode) is once ended after the process passes via the address adder 44, it is possible to carry out the memory copy between the next addresses by the stride function. That is, when generating the address, the process passes via two address adders, but the first address (MVSA/MVDA) remains to be the address of MVSA/MVDA register 32 or 33 according to the formulas (1) and (2) described above.

Second, when the condition of the MVS register 34 is satisfied, the mover function (or M mode) ends in FIGS. 18 and 19. But when the stride valid register 13 is ON and the stride count matches the setting of the SLR register 40, the signal stride_finish is issued similarly as in FIGS. 13 through 17, and the end of the mover function (or M mode) is judged when the address status circuit 25 receives the signal stride_finish.

In FIG. 20, a step S201 regards the address, that is generated using the combination of the address adder 37 and the multiplier 41, as the address that is to be output to the bus interface unit 56 in the step S82. In addition, a step S202 regards the address, that is generated using the combination of the address adder 38 and the multiplier 41, as the address that is to be output to the bus interface unit 56 in the step S90. Furthermore, a step S203 regards the address, that is generated using the combination of the address adder 37 and the multiplier 41, as the address that is to be output to the bus interface unit 56 in the step S82-1.

In FIG. 21, after the step S102, a step S204 judges whether or not the stride valid register 13 is ON. If the judgement result in the step S204 is YES, a step S205 issues the signal stride_next from the address status circuit 25. A step S206 compares and judges whether or not the number of strides set in the SLR register 40 by the stride counting circuit 42 matches the present counted value. If the judgement result in the step S206 is NO, a step S207 address "1" to the counted value of the stride counting circuit 42, and delivers the counted value of the stride counting circuit 42 to the multiplier 41. A step S208 computes the formula (2) described above by the multiplier 41 based on the value of the BAR register 31, the value of the SAR register 39 and the counted value of the stride counting circuit 42, and outputs the address for the next DMA write. On the other hand, if the judgement result in the step S206 is YES, a step S209 issues the signal stride_finish by the stride counting circuit 42 and delivers the signal stride_finish to the address status circuit 25. A step S210 clears the counted value of the stride counting circuit 42, that is initializes the counted value to "0". If the judgement result in the step S204 is NO or, after the step S210, the process advances to the step S103. In addition, a step S211 regards the address, that is generated using the combination of the address adder 38 and the multiplier 41, as the address that is to be output to the bus interface unit 56 in the step S90-1.

Second Embodiment

Next, a description will be given of the sixteenth through nineteenth mechanisms described above.

Figure 22:
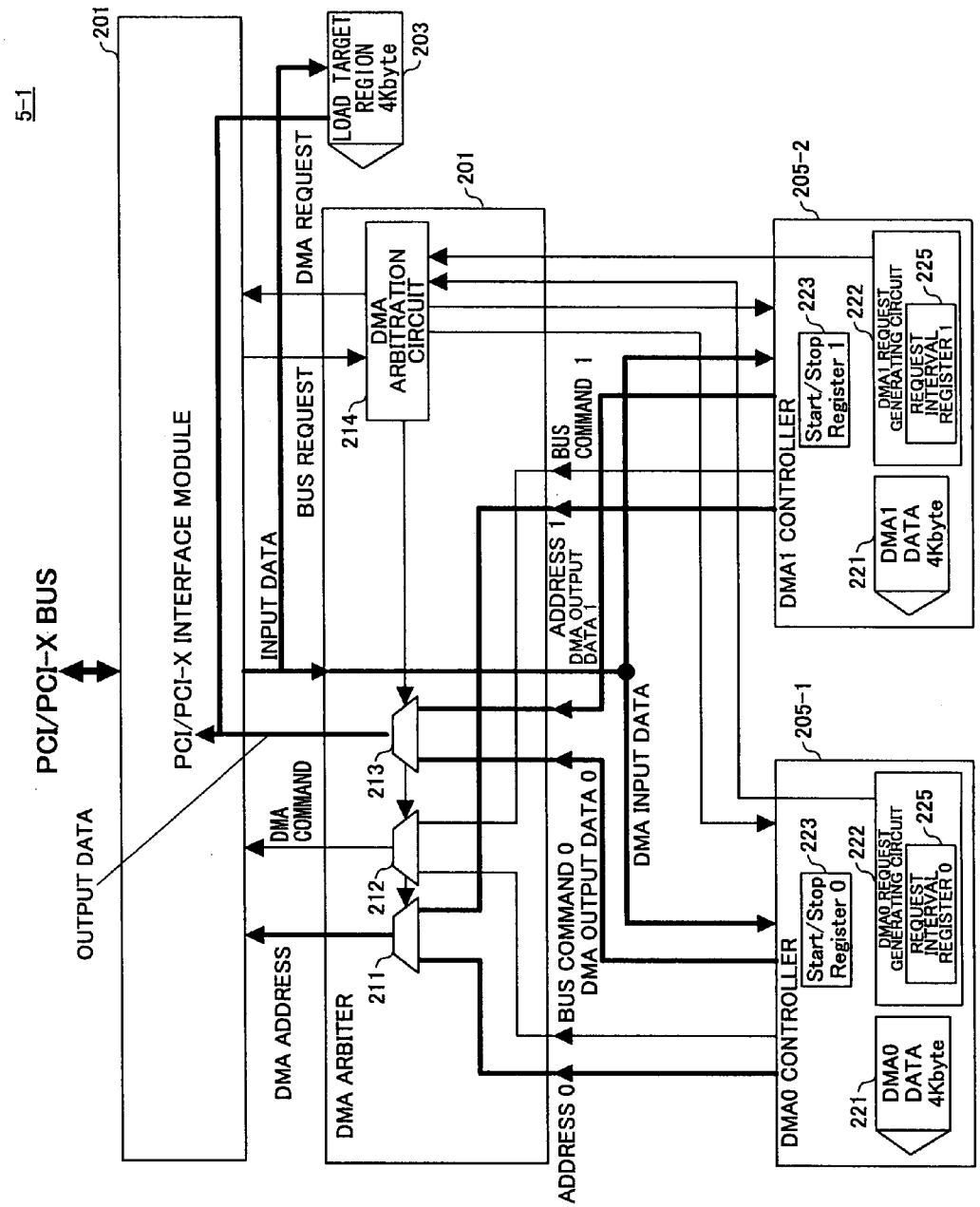
FIG. 22 is a block diagram showing a second embodiment of the load generating apparatus according to the present invention.
Figure 23:
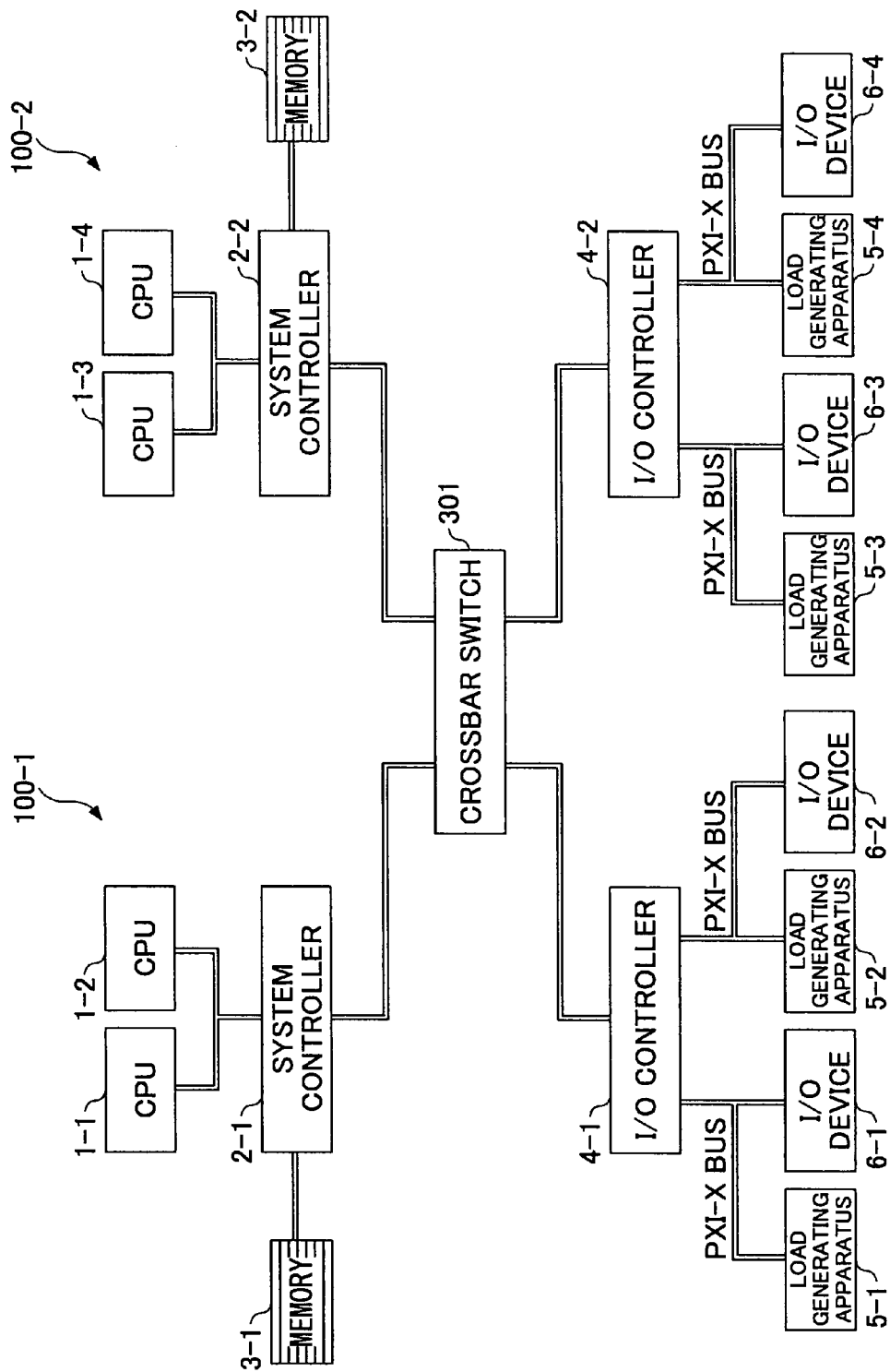
FIG. 23 is a system block diagram showing the second embodiment of the load generating apparatus together with a test target system which becomes a target of a load test.

FIG. 22 is a block diagram showing a second embodiment of the load generating apparatus according to the present invention, and FIG. 23 is a system block diagram showing this second embodiment of the load generating apparatus together with a test target system which becomes a target of a load test. This second embodiment of the load generating apparatus employs a second embodiment of the load testing method according to the present invention.

A load generating apparatus 5-1 shown in FIG. 22 has a PCI/PCI-X interface module 201 that supports the PCI bus, a DMA arbiter 202, a load target region 203, and DMA controllers 205-1 and 205-2.

The DMA arbiter 202 has a selector 211 which receives address signals from the DMA controllers 205-1 and 205-2, a selector 212 which receives bus commands from the DMA controllers 205-1 and 205-2, a selector 213 which receives DMA output data from the DMA controllers 205-1 and 205-2, and a DMA arbitration circuit 214 which carries out an arbitration based on DMA request from the DMA controllers 205-1 and 205-2. The DMA arbitration circuit 214 selectively outputs the inputs to each of the selectors 211 through 213 based on the arbitration result, and inputs the DMA request to the PCI/PCI-X interface module 201. The DMA address, the DMA command and the output data from the selectors 211, 212 and 213 are input to the PCI/PCI-X interface module 201. In addition, the DMA arbitration circuit 214 carries out an arbitration based on the bus request from the PCI/PCI-X interface module 201, and inputs the request to the DMA controllers 205-1 and 205-2 based on the arbitration result. The input data from the PCI/PCI-X interface module 201 is input to the DMA controllers 205-1 and 205-2 as the DMA input data. The load target region 203 is set to a maximum data size transferable at one time by the PCI/PCI-X interface module 201, and is 4 kbytes, for example.

Each of the DMA controllers 205-1 and 205-2 has a DMA data region 221, a DMA request generating circuit 222, and a start/stop register 223. The DMA request generating circuit 222 includes a request interval register 225 to which the DMA request interval is set. Each of the DMA controllers 205-1 and 205-2 has a structure including the first through fifteenth mechanisms, similarly to the load generating apparatus 5 shown in FIG. 4. Furthermore, the DMA is executed when the value "1" is set in the start/stop register 223 by each of the DMA controllers 205-1 and 205-2, and the DMA is ended when the value "0" is set in the start/stop register 223.

In FIG. 23, a crossbar switch 301 is provided with respect to the structure shown in FIG. 3, so as to provide a large number of system controllers and I/O controllers. Hence, a plurality of targets having load target addresses, such as a plurality of memories and a plurality of I/O devices which are under the control of each I/O controller, are provided with respect to the load generating apparatus. In other words, a plurality of test target systems 100-1 and 100-2 exist.

In one example of the load test with respect to the test target systems 100-1 and 100-2, the access is made from the load generating apparatus 5-1 with respect to the memories 3-1 and 3-2 or the I/O devices 6-3 and 6-4 which are under the control of the I/O controller 4-2. In general, the address space allocation and access method are different between the memory and the I/O device. For this reason, if only one DMA controller is provided within each load generating apparatus, only one target can be accessed. But in this embodiment, two DMA controllers 205-1 and 205-2 are provided within one load generating apparatus (for example, the load generating apparatus 5-1), and the sixteenth mechanism enables simultaneous access to the memory (coherency space) and the I/O device (non-coherency space) by the single load generating apparatus. In this embodiment, the access may of course be made between the coherency spaces or, between the non-coherency spaces.

By providing a plurality of sixteenth mechanisms each including all of the first through fifteenth mechanisms, it becomes possible to independently set the parameters and realize random test patterns.

In addition, by providing the DMA request generating circuit 222 in each of the DMA controllers 205-1 and 205-2, it becomes possible to arbitrarily se the DMA request interval, that is, the DMA execution interval (the time it takes from the end of the DMA to the issuance of the DMA). The DMA requests output from the DMA request generating circuits 222 of the DMA controllers 205-1 and 205-2 are delivered to the DMA arbitration circuit 214 of the DMA arbiter 202, and one of the DMA requests to be accepted is determined according to the LRU system.

Accordingly, by providing the seventeenth mechanism which independently adjusts the DMA request interval to the PCI/PCI-X bus (I/O bus) from each of the DMA controllers 205-1 and 205-2 having the thirteenth mechanism, it becomes possible to realize the random test patterns.

By combining the seventeenth mechanism and the sixteenth mechanisms, the test patterns do not become too simple, and the test patterns can be made more random compared to the case where the load test is executed using a single DMA controller. For this reason, it is possible to easily realize the load with respect to the system controllers 2-1 and 2-2, the I/O controllers 4-1 and 4-2, and the crossbar switch 301 which is an access trunking LSI.

In this embodiment, the load target region 203 is provided, and the eighteenth mechanism has the target address space of the load test. In the particular case shown in FIG. 23, the load target region 203 forms a data region that is effective for the load test of the access between the load generating apparatuses 5-1 and 5-4 or, the access from the CPU 1-1 to the load generating apparatus 5-3. Such accesses are important items of the load test. In this embodiment, the load target region 203 is set to 5 kbytes, which is the maximum data size transferable by the PCI/PCI-X interface module 201 at one time. In case where the register setting or the polling alone does not generate the load or, the data size is an important element of the load test, it is important to provide the load target region 203. Furthermore, by providing the load target region 203 independently of the DMA controllers 205-1 and 205-2, it becomes possible to execute the load test described above even when the DMA controllers 205-1 and 205-2 are operating simultaneously.

The DMA data region 211 within each of the DMA controllers 205-1 and 205-2 corresponds to the DATA register 48 shown in FIG. 4. The size of this DMA data region 221 (DATA register 48) is 4 kbytes as described above, which is the maximum data size transferable by the PCI/PCI-X interface module 201 at one time. In this embodiment, two DMA controllers 205-1 and 205-2 are provided within one load generating apparatus (for example, the load generating apparatus 5-1), and each of the DMA controllers 205-1 and 205-2 is provided with the first through fifteenth mechanism and the nineteenth mechanism including the DMA data region 221 having the maximum data size transferable by the PCI/PCI-X interface module 201 at one time. Hence, each of the DMA controllers 205-1 and 205-2 only requires the DMA data region 221 having the maximum amount transferable by the I/O bus to which the PCI/PCI-X interface module 201 connects. For this reason, each of the DMA controllers 205-1 and 205-2 only needs to have the DMA data region 221 amounting to the maximum data size to be transferred in order to execute the load test with a high load and various load patterns.

Therefore, according to the present invention, it is possible to realize, using minimum hardware resources, a load test with respect to a large address space, and a high load with various access patterns and data patterns, which were conventionally impossible unless a large number of hard disks were used. In addition, the present invention can make the data pattern unique, so as to facilitate the inspection and debugging of the test target system.

Further, the present invention is not limited to these embodiments, but various variations and modifications may be made without departing from the scope of the present invention.

What is claimed is:

1. A load generating apparatus for applying a load on a bus of a test target system, comprising:
    a mode setting register to which an operation mode is set;
    a data size register to which a data size of one data transfer is set;
    a register group to which a base address which is a first access target address, an address interval for every stride executed by a stride function, and a number of strides are set; and
    an access part configured to access a memory space within the test target system based on the data size set in the data size register and information set in the register group, depending on the operation mode set in the mode setting register,
    wherein the access part includes a changing mechanism configured to change the access target address to the memory space at the address interval, and a generating mechanism configured to generate a data pattern depending on the address interval and the data size, with respect to the memory space of the access target.

2. The load generating apparatus as claimed in claim 1, wherein the operation mode includes a write only mode in which only a write operation is made from the load generating apparatus with respect to the bus, a read only mode in which only a read operation is made from the load generating apparatus with respect to the bus, a write with compare mode in which the load generating apparatus sequentially makes a write operation and a read operation with respect to the bus and inspects a match between a written data and a read data during the read operation, and a mover mode in which a memory copy function is realized by reading a data from a certain address space and writing the data to a different address space.

3. The load generating apparatus as claimed in claim 2, wherein an amount of data to be copied in the mover mode is also set to the register group.

4. The load generating apparatus as claimed in claim 1, wherein the changing mechanism carries out an operation of accessing the memory space at intervals when the address interval is greater than the data size, an operation of continuously accessing the memory space when the address interval is equal to the data size, and an operation of accessing the memory space while shifting the address when the address interval is smaller than the data size, so as to generate different access patterns.

5. The load generating apparatus as claimed in claim 1, wherein an ON or OFF state of the stride function is also set in the register group, and the generation of the data pattern by the generating mechanism is suppressed depending on the ON or OFF state of the stride function.

6. The load generating apparatus as claimed in claim 1, wherein the information of the register group, the data size register and the mode setting register is set from the test target system prior to a test of the test target system.

7. The load generating apparatus as claimed in claim 1, wherein a start and an end of an operation of the load generating apparatus are controlled by software of the test target system, and the operation of the load generating apparatus continues independently of the software once started unless ended by a control of the software.

8. A load testing method for applying a load on a bus of a test target system, comprising:
- a setting step setting from the test target system to registers within a load generating apparatus, prior to a test of the test target system, an operation mode, a data size of one data transfer, a base address which is a first access target address, an address interval for every stride executed by a stride function, and a number of strides; and
- an accessing step accessing a memory space within the test target system from the load generating apparatus, based on the data size, the base address, the address interval, and the number of strides that are set by the setting step, depending on the operation mode that is set by the setting step,
- wherein the accessing step includes a changing step changing the access target address to the memory space at the address interval, and a generating step generating a data pattern depending on the address interval and the data size, with respect to the memory space of the access target.

9. The load testing method as claimed in claim 8, wherein the operation mode includes a write only mode in which only a write operation is made from the load generating apparatus with respect to the bus, a read only mode in which only a read operation is made from the load generating apparatus with respect to the bus, a write with compare mode in which the load generating apparatus sequentially makes a write operation and a read operation with respect to the bus and inspects a match between a written data and a read data during the read operation, and a mover mode in which a memory copy function is realized by reading a data from a certain address space and writing the data to a different address space.

10. The load testing method as claimed in claim 9, wherein the setting step also sets an amount of data to be copied in the mover mode to the registers.

11. The load testing method as claimed in claim 8, wherein the changing step carries out an operation of accessing the memory space at intervals when the address interval is greater than the data size, an operation of continuously accessing the memory space when the address interval is equal to the data size, and an operation of accessing the memory space while shifting the address when the address interval is smaller than the data size, so as to generate different access patterns.

12. The load testing method as claimed in claim 8, wherein the setting step also sets an ON or OFF state of the stride function to the registers, and the generation of the data pattern by the generating step is suppressed depending on the ON or OFF state of the stride function.

13. The load testing method as claimed in claim 8, comprising:
- a step controlling a start and an end of an operation of the load generating apparatus by software of the test target system,
- wherein the operation of the load generating apparatus continues independently of the software once started unless ended by a control of the software.

* * * * *